United States Patent
Kwon et al.

(10) Patent No.: US 10,411,082 B2
(45) Date of Patent: Sep. 10, 2019

(54) DISPLAY DEVICE

(71) Applicant: SAMSUNG DISPLAY CO., LTD., Yongin-si, Gyeonggi-do (KR)

(72) Inventors: Wonju Kwon, Cheonan-si (KR); Heesong Jeong, Seoul (KR); Dalho Kim, Hwaseong-si (KR); Sangmin Hong, Cheonan-si (KR); Hyomin Kim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/985,834

(22) Filed: May 22, 2018

(65) Prior Publication Data

US 2018/0342571 A1 Nov. 29, 2018

(30) Foreign Application Priority Data

May 25, 2017 (KR) ........................ 10-2014-0064460

(51) Int. Cl.
*H01L 27/32* (2006.01)
*H01L 51/52* (2006.01)
*G09G 3/3233* (2016.01)

(52) U.S. Cl.
CPC ....... *H01L 27/3276* (2013.01); *G09G 3/3233* (2013.01); *H01L 27/3216* (2013.01); *H01L 27/3218* (2013.01); *H01L 27/3297* (2013.01); *H01L 51/5206* (2013.01); *H01L 51/5221* (2013.01); *H01L 51/5281* (2013.01); *G09G 2310/0264* (2013.01)

(58) Field of Classification Search
CPC ............ H01L 27/3276; H01L 51/5206; H01L 27/3218; H01L 51/5221; H01L 51/5281; H01L 27/3216; H01L 27/3297; G09G 3/3233; G09G 2310/0264
See application file for complete search history.

(56) References Cited

U.S. PATENT DOCUMENTS 8,698,395 B2    4/2014  Im et al.
8,816,580 B2    8/2014  Lee et al.
(Continued)

FOREIGN PATENT DOCUMENTS

KR          100700013 B1     3/2007
KR       1020140001018 A     1/2014
(Continued)

*Primary Examiner* — Abbas I Abdulselam
(74) *Attorney, Agent, or Firm* — Cantor Colburn LLP

(57) ABSTRACT

A display device includes: a substrate including first and second sides; first and second pixels connected to different scan lines; a light blocking layer defining first and second light emission areas of the first and second pixels; and patterns overlapping the first and second light emission areas and on different layers between a pixel electrode and the substrate. Each emission area is divided into first and second divided areas, between which the first divided area is the closer to the first side. In the first light emission area, an overlap area between the second divided area and the first pattern is larger than an overlap area between the first divided area and the first pattern. In the second light emission area, an overlap area between the first divided area and the first pattern is larger than an overlap area between the second divided area and the first pattern.

23 Claims, 23 Drawing Sheets

(56) References Cited

U.S. PATENT DOCUMENTS

| | | | | |
|---|---|---|---|---|
| 2008/0111475 A1* | 5/2008 | Baek | ................... | H01L 27/3272 |
| | | | | 313/504 |
| 2014/0071030 A1 | 3/2014 | Lee | | |
| 2016/0118449 A1* | 4/2016 | Sato | ................... | H01L 27/3246 |
| | | | | 257/89 |

FOREIGN PATENT DOCUMENTS

| | | |
|---|---|---|
| KR | 1020160048744 A | 5/2016 |
| KR | 1020160108669 A | 9/2016 |

* cited by examiner

DISPLAY DEVICE

This application claims priority to Korean Patent Application No. 10-2017-0064460, filed on May 25, 2017, and all the benefits accruing therefrom under 35 U.S.C. § 119, the content of which in its entirety is herein incorporated by reference.

BACKGROUND

1. Field

Embodiments of the invention relate to a display device, and more particularly, to a display device with substantially minimized white angular difference ("WAD") depending on the viewing direction.

2. Discussion of Related Art

Flat panel display ("FPD") devices are widely used in various fields due to desired characteristics thereof, such as light weight and reduced volume compared to cathode ray tubes ("CRT"). The FPD devices may include liquid crystal display ("LCD") devices, field emission display ("FED") devices, plasma display panel ("PDP") devices, organic light emitting diode ("OLED") display devices and the like.

Among the FPD devices, the OLED display device displays an image using an OLED which may generate light by recombination of electrons and holes.

SUMMARY

Embodiments of the invention are directed to a display device with substantially minimized white angular difference ("WAD") depending on the viewing direction.

According to an exemplary embodiment, a display device includes: a substrate including a first side and a second side facing each other; a first pixel and a second pixel connected to different scan lines, respectively, where the first pixel includes a first pixel electrode on the substrate and the second pixel includes a second pixel electrode on the substrate; a light blocking layer defining a first light emission area corresponding to the first pixel and a second light emission area corresponding to the second pixel; and a plurality of patterns overlapping the first light emission area and the second light emission area and on different layers between the first pixel electrode and the substrate, respectively, where a first pattern of a plurality of patterns is the closest to the first pixel electrode or the second pixel electrode. In such an embodiment, each of the first and second light emission areas is divided into a first divided area and a second divided area, the first divided area is closer to the first side than to the second side, an overlap area between the second divided area of the first light emission area and the first pattern is larger than an overlap area between the first divided area of the first light emission area and the first pattern, and an overlap area between the first divided area of the second light emission area and the first pattern is larger than an overlap area between the second divided area of the second light emission area and the first pattern.

In an exemplary embodiment, the display device may further include: a first light emission control line connected to the first pixel; and a second light emission control line connected to the second pixel.

In an exemplary embodiment, the first light emission control line and the second light emission control line may be adjacent to each other.

In an exemplary embodiment, the first light emission control line may be an odd-numbered light emission control line, and the second light emission control line may be an even-numbered light emission control line.

In an exemplary embodiment, the first pixel and the second pixel may emit lights having a substantially same color as each other.

In an exemplary embodiment, the first pixel may emit a red light or a blue light.

In an exemplary embodiment, the first pixel and the second pixel may be connected to different data lines, respectively.

In an exemplary embodiment, the display device may further include another data line disposed between the different data lines connected to the first and second pixels, respectively.

In an exemplary embodiment, a size of the first light emission area may be substantially equal to a size of the second light emission area.

In an exemplary embodiment, the first pixel and the second pixel may emit lights having different colors from each other.

In an exemplary embodiment, the first pixel may emit a red light or a blue light, and the second pixel may emit a red light or a blue light.

In an exemplary embodiment, the first pixel and the second pixel may be connected to a same data line.

In an exemplary embodiment, a size of the first light emission area may be different from a size of the second light emission area.

In an exemplary embodiment, the first pattern may include: a plurality of data lines connected to a plurality of pixels including the first pixel and the second pixel; a power supply line connected to the plurality of pixels including the first pixel and the second pixel; a plurality of first connection electrodes connected to a plurality of pixel electrodes including the first pixel electrode and the second pixel electrode; and a second connection electrode and a third connection electrode overlapping the different scan lines.

In an exemplary embodiment, the first light emission area may overlap another data line adjacent to a data line connected to the first pixel.

In an exemplary embodiment, the second light emission area may overlap another data line adjacent to a data line connected to the second pixel.

In an exemplary embodiment, the first side and the second side may be parallel to the data lines.

In an exemplary embodiment, a size of the first divided area may be substantially equal to a size of the second divided area.

In an exemplary embodiment, the first divided area and the second divided area may have a symmetrical shape with respect to an imaginary division line crossing a center of the first or second light emission area.

In an exemplary embodiment, each of the first light emission area and the second light emission area may have a rhombic shape or a quadrangular shape.

In an exemplary embodiment, the display device may further include: a third pixel connected to a scan line the same as a scan line to which the first pixel is connected; a fourth pixel connected to a scan line the same as a scan line to which the first pixel is connected; and a fifth pixel connected to a scan line the same as a scan line to which the second pixel is connected. In such an embodiment, the light blocking layer may further define a third light emission area corresponding to the third pixel, a fourth light emission area corresponding to the fourth pixel, and a fifth light emission area corresponding to the fifth pixel In an exemplary embodiment, the first light emission area and the fifth light emission area may face each other in a first diagonal direction with the fourth light emission area interposed therebetween, and the second light emission area and the third light emission area may face each other in a second diagonal direction which intersects the first diagonal direction with the fourth light emission area interposed therebetween.

In an exemplary embodiment, a distance between the fourth light emission area and the first light emission area may be substantially equal to a distance between the fourth light emission area and the fifth light emission area; and a distance between the fourth light emission area and the second light emission area may be substantially equal to a distance between the fourth light emission area and the third light emission area.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
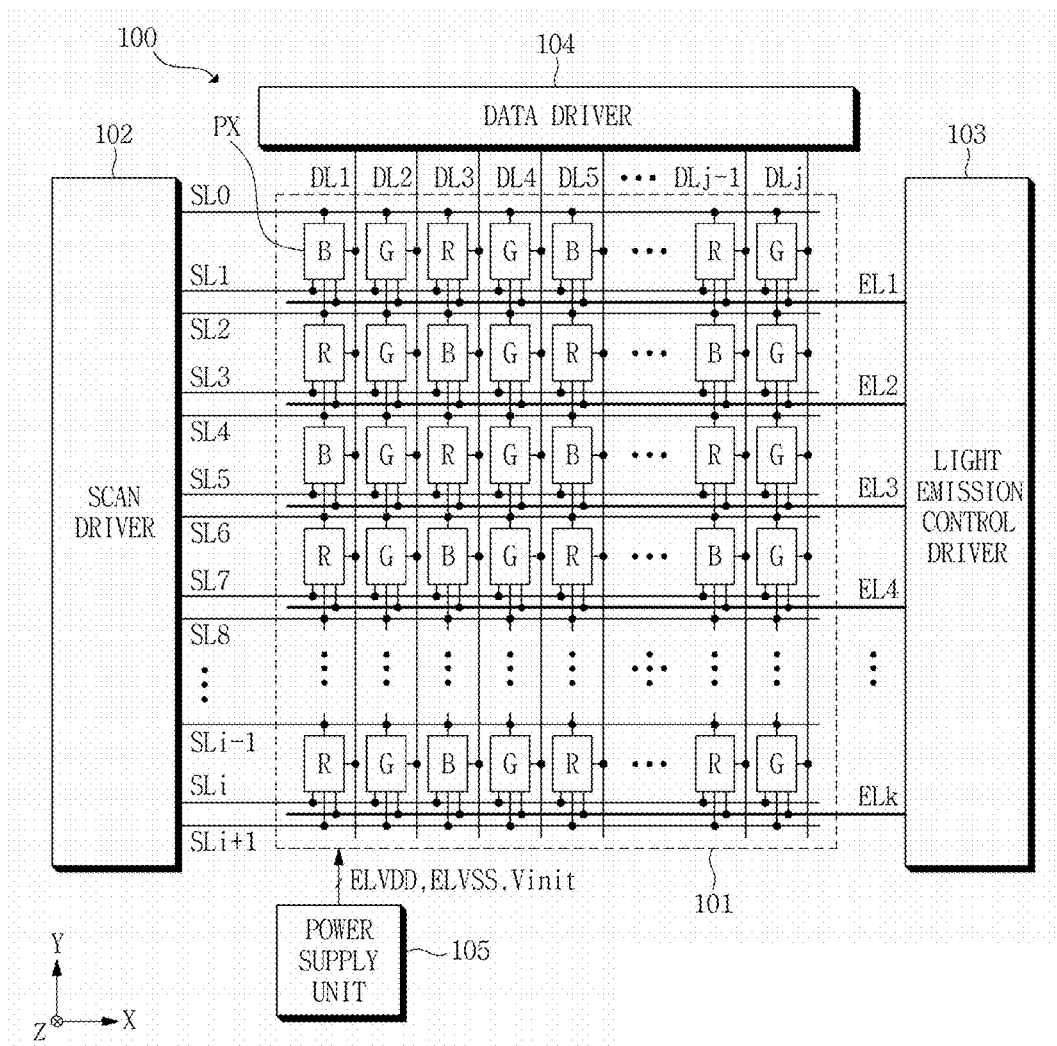
FIG. 1 is a block diagram illustrating a display device according to an exemplary embodiment.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Some of the parts which are not associated with the description may not be provided in order to For example describe embodiments of the invention and like reference numerals refer to like elements throughout the specification.

Hereinafter, exemplary embodiments of a display device according to the invention will be described in detail with reference to FIGS. 1 to 11B.

FIG. 1 is a block diagram illustrating a display device 100 according to an exemplary embodiment.

In an exemplary embodiment, as shown in FIG. 1, the display device 100 includes a display panel 101, a scan driver 102, a light emission control driver 103, a data driver 104 and a power supply unit 105.

The display panel 101 may include "i+2" number of scan lines SL0 to SLi+1, "i" number of light emission control lines EL1 to ELk, "j" number of data lines DL1 to DLj and "ixj" number of pixels PX, where each of i, j and k is a natural number greater than 1.

The scan lines SL0 to SLi+1 are arranged along a y-axis direction, and each of the scan lines SL0 to SLi+1 extends along an x-axis direction. The light emission control lines EL1 to ELk are arranged along the y-axis direction, and each of the light emission control lines EL1 to ELk extends along the x-axis direction. The data lines DL1 to DLj are arranged along the x-axis direction, and each of the data lines DL1 to DLj extends along the y-axis direction.

In an exemplary embodiment, a scan line SL0 of the scan lines SL0 to SLi+1 that is closest to the data driver 104 is defined as a first dummy scan line SL0, and a scan line SLi+1 of the scan lines SL0 to SLi+1 that is farthest from the data driver 104 is defined as a second dummy scan line SLi+1. In such an embodiment, the scan lines SL1 to SLi between the first dummy scan line SL0 and the second dummy scan line SLi+1 are respectively defined as first to i-th scan lines SL1 to SLi sequentially from a scan line that is close to the data driver 104.

The scan driver 102 generates scan signals based on a scan control signal provided from a timing controller (not illustrated), and sequentially applies the scan signals to the plurality of scan lines SL0 to SLi+1. The scan driver 102 outputs first to i-th scan signals, a first dummy scan signal and a second dummy scan signal. The first to i-th scan signals output from the scan driver 102 are applied to the first to i-th scan lines SL1 to SLi, respectively. In one exemplary embodiment, for example, an n-th scan signal is applied to an n-th scan line SLn, where n is a natural number greater than or equal to 1 and less than or equal to i. In such an embodiment, the first dummy scan signal output from the scan driver 102 is applied to the first dummy scan line SL0 and the second dummy scan signal output from the scan driver 102 is applied to the second dummy scan line SLi+1.

During one frame period, the scan driver 102 outputs the first to i-th scan signals sequentially from the first scan signal. In such an embodiment, the scan driver 102 outputs the first dummy scan signal prior to the first scan signal, and outputs the second dummy scan signal later than the i-th scan signal. In such an embodiment, the scan driver 102 outputs the first dummy scan signal firstly during said one frame period, and outputs the second dummy scan signal lastly during said one frame period. Accordingly, during one frame period, the entire scan lines SL0 to SLi+1 including the dummy scan lines SL0 and SLi+1 are driven sequentially from the first dummy scan line SL0.

The light emission control driver 103 generates light emission control signals based on a control signal provided from the timing controller (not illustrated), and sequentially applies the light emission control signals to the plurality of light emission control lines EL1 to ELk. First to m-th light emission control signals output from the light emission control driver 103 are applied to first to m-th light emission control lines EL1 to ELm, respectively. In one exemplary embodiment, for example, the m-th light emission control signal is applied to the m-th light emission control line ELm, where m is a natural number greater than or equal to 1 and less than or equal to k. During one frame period, the light emission control driver 103 outputs the first to k-th light emission control signals sequentially from the first light emission control signal. Accordingly, during one frame period, the entire light emission control lines EL1 to ELk are driven sequentially from the first light emission control line EL1.

In an exemplary embodiment, the light emission control driver 103 may be embedded in the scan driver 102. In one exemplary embodiment, for example, the scan driver 102 may function as the light emission control driver 103. In such an embodiment, the scan lines SL0 to SLi+1 and the light emission control lines EL1 to ELk are driven together by the scan driver 102.

The data driver 104 applies first to i-th data voltages to the first to j-th data lines DL1 to DLj, respectively. In one exemplary embodiment, for example, the data driver 104 receives image data signals and data control signals from the timing controller (not illustrated). In such an embodiment, the data driver 104 samples the image data signals based on the data control signal, latches the sampled image data signals corresponding to one horizontal line in each horizontal period, and substantially simultaneously applies the latched image data signals to the data lines DL1 to DLj.

The pixels PX are arranged in the display panel 101 in a matrix form. The pixels PX may be disposed in a display area of the display panel 101. The pixels PX emit lights having different colors from each other. In one exemplary embodiment, for example, among pixels PX illustrated in FIG. 1, a pixel indicated by a reference character "R" is a red pixel which emits a red light, a pixel indicated by a reference character "G" is a green pixel which emits a green light, and a pixel indicated by a reference character "B" is a blue pixel which emits a blue light.

In an exemplary embodiment, although not illustrated, the display panel 101 may further include a white pixel which emits a white light.

One pixel is connected to at least one scan line. In an exemplary, as illustrated in FIG. 1, among a plurality of pixels PX connected to the first data line DL1, a blue pixel which is closest to the data driver 104 is connected to three scan lines that receives scan signals having different output timings, e.g., the first dummy scan line SL0, the first scan line SL1 and the second scan line SL2. in such an embodiment, among a plurality of pixels PX connected to the second data line DL2, a green pixel which is third closest from the data driver 104 is connected to three scan lines that receives scan signals having different output timings, e.g., the fourth scan line SL4, the fifth scan line SL5 and the sixth scan line SL6.

In an exemplary embodiment, pixels that are connected in common to a same data line and located adjacent to each other are connected in common to at least one scan line. In such an embodiment, two adjacent ones of the pixels connected to a same data line that are adjacent to each other in the y-axis direction share at least one scan line. In one exemplary embodiment, for example, a green pixel (hereinafter, referred to as "a first green pixel") which is connected to the second data line DL2 and is closest to the data driver 104 and a green pixel (hereinafter, referred to as "a second green pixel") which is connected to the second data line DL2 and is second closest from the data driver 104 are located adjacent to each other, and the first green pixel and the second green pixel are connected in common to the second scan line SL2. In such an embodiment, when defining a green pixel that is connected to the second data line DL2 and third closest from the data driver 104 as a third green pixel, the third green pixel and the second green pixel are connected in common to the fourth scan line SL4.

Each of pixels connected in common to a same data line is independently connected to at least one different scan line. In one exemplary embodiment, for example, the first green pixel described above is connected independently to the first scan line SL1, the second green pixel described above is connected to the third scan line SL3, and the third green pixel described above is connected independently to the fifth scan line SL5.

As such, each of pixels connected to a same data line are independently connected to at least one scan line. Hereinafter, the meaning of at least two pixels (e.g., the first pixel PX1 and the second pixel PX2) being respectively connected to different scan lines is that at least one of scan lines connected to the first pixel PX1 is different from at least one of scan lines connected to the second pixel PX2. Accordingly, pixels connected to a same data line are connected to different scan lines, respectively.

Herein, the meaning of at least two pixels (e.g., the first pixel PX1 and the second pixel PX2) being connected to a same scan line is that scan lines connected to the first pixel PX1 are completely the same as scan lines connected to the second pixel PX2. Accordingly, each of pixels connected to a same light emission control line are connected to same scan lines. In an exemplary embodiment, pixels connected in common to the second light emission control line EL2 are connected in common to the second scan line SL2, the third scan line SL3 and the fourth scan line SL4, for example.

The red pixel and the blue pixel are connected to a (2p−1)-th data line and the green pixel is connected to a 2q-th data line, where p is a natural number. In one exemplary embodiment, for example, the red pixel and the blue pixel are connected to the first data line DL1, and the green pixel is connected to the second data line DL2.

One pixel (hereinafter, "a first predetermined pixel") connected to a (2p−1)-th data line (e.g., the first data line DL1) and one pixel (hereinafter, "a second predetermined pixel") connected to (2p+1)-th data line (e.g., the third data line DL3) may be connected to a same scan line, and in such an embodiment, the first predetermined pixel emits a light having a color different from a color of a light emitted from the second predetermined pixel. In one exemplary embodiment, for example, the first predetermined pixel is a blue pixel connected to the first dummy scan line SL0, the first scan line SL1, the second scan line SL2 and the first data line DL1 and the second predetermined pixel may be a red pixel connected to the first dummy scan line SL0, the first scan line SL1, the second scan line SL2 and the third data line DL3.

Two adjacent pixels that are connected to a same data line (e.g., the (2p−1)-th data line) and emit lights having different colors and at least one green pixel adjacent to one of the two adjacent pixels collectively define a unit pixel for displaying a unit color image. In one exemplary embodiment, for example, a red pixel connected to the third data line DL3 and the first scan line SL1, a blue pixel connected to the third data line DL3 and the third scan line SL3, a green pixel connected to the second data line DL2 and the first scan line SL1 and a green pixel connected to the fourth data line DL4 and the first scan line SL1 may collectively define a unit pixel.

Each pixel PX commonly receives a high potential driving voltage ELVDD, a low potential driving voltage ELVSS and an initializing voltage Vinit from a power supply unit 105. In such an embodiment, each pixel PX receives all of the high potential driving voltage ELVDD, the low potential driving voltage ELVSS and the initializing voltage Vinit.

Figure 2:
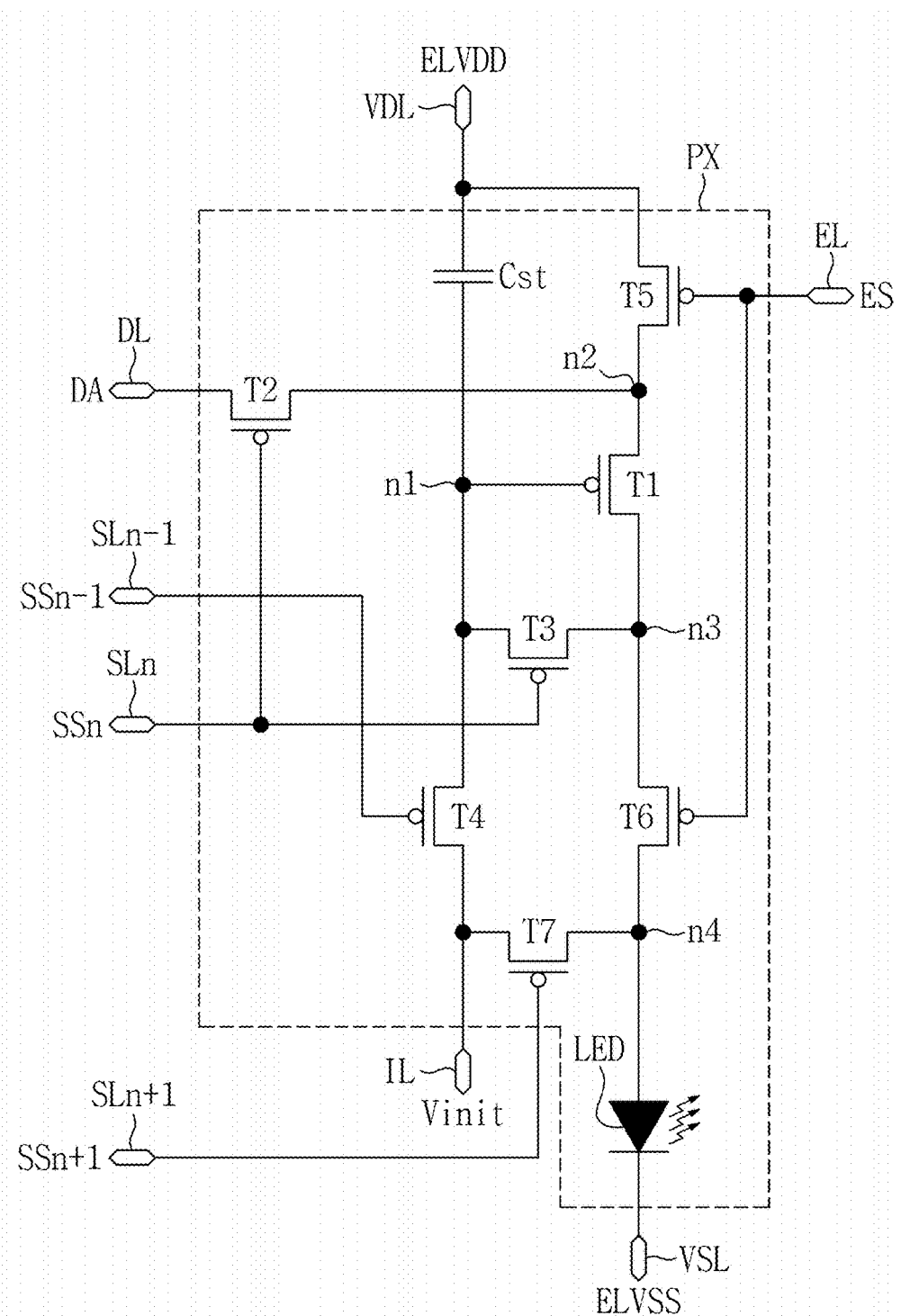
FIG. 2 is an equivalent circuit diagram illustrating a pixel illustrated in FIG. 1.

FIG. 2 is an equivalent circuit diagram illustrating a pixel illustrated in FIG. 1.

In an exemplary embodiment, as illustrated in FIG. 2, a pixel includes a first switching element T1, a second switching element T2, a third switching element T3, a fourth switching element T4, a fifth switching element T5, a sixth switching element T6, a seventh switching element T7, a storage capacitor Cst and a light emitting element (hereinafter, referred to as a light emitting diode ("LED")).

Each of the first, second, third, fourth, fifth, sixth and seventh switching elements T1, T2, T3, T4, T5, T6 and T7 may be a P-type transistor, as illustrated in FIG. 2. However, exemplary embodiments are not limited thereto, and in an alternative exemplary embodiment, each of the first, second, third, fourth, fifth, sixth and seventh switching elements T1, T2, T3, T4, T5, T6 and T7 may be an N-type transistor.

The first switching element T1 includes a gate electrode connected to a first node n1 and is connected between a second node n2 and a third node n3. One of a source electrode and a drain electrode of the first switching element T1 is connected to the second node n2, and the other of the source electrode and the drain electrode of the first switching element T1 is connected to the third node n3.

The second switching element T2 includes a gate electrode connected to the n-th scan line SLn and is connected between the data line DL and the second node n2. One of a source electrode and a drain electrode of the second switching element T2 is connected to the data line DL, and the other of the source electrode and the drain electrode of the second switching element T2 is connected to the second node n2. An n-th scan signal SSn is applied to the n-th scan line SLn.

The third switching element T3 includes a gate electrode connected to the n-th scan line SLn and is connected between the first node n1 and the third node n3. One of a source electrode and a drain electrode of the third switching element T3 is connected to the first node n1, and the other of the source electrode and the drain electrode of the third switching element T3 is connected to the third node n3.

The fourth switching element T4 includes a gate electrode connected to an (n−1)-th scan line SLn−1 and is connected between the first node n1 and an initialization line IL. One of a source electrode and a drain electrode of the fourth switching element T4 is connected to the first node n1, and the other of the source electrode and the drain electrode of the fourth switching element T4 is connected to the initialization line IL. The initializing voltage Vinit shown in FIG. 1 is applied to the initialization line IL, and an (n−1)-th scan signal SSn−1 is applied to the (n−1)-th scan line SLn−1.

The fifth switching element T5 includes a gate electrode connected to the light emission control line EL and is connected between a high potential line VDL, which is one of power supply lines, and the second node n2. One of a source electrode and a drain electrode of the fifth switching element T5 is connected to the high potential line VDL, and the other of the source electrode and the drain electrode of the fifth switching element T5 is connected to the second node n2. The high potential driving voltage ELVDD shown in FIG. 1 is applied to the high potential line VDL.

The sixth switching element T6 includes a gate electrode connected to the light emission control line EL and is connected between the third node n3 and a fourth node n4. One of a source electrode and a drain electrode of the sixth switching element T6 is connected to the third node n3, and the other of the source electrode and the drain electrode of the sixth switching element T6 is connected to the fourth node n4. A light emission control signal ES is applied to the light emission control line EL.

The seventh switching element T7 includes a gate electrode connected to an (n+1)-th scan line SLn+1 and is connected between the initialization line IL and the fourth node n4. One of a source electrode and a drain electrode of the seventh switching element T7 is connected to the initialization line IL, and the other of the source electrode and the drain electrode of the seventh switching element T7 is connected to the fourth node n4. An (n+1)-th scan signal SSn+1 is applied to the (n+1)-th scan line SLn+1.

The storage capacitor Cst is connected between the high potential line VDL and the first node n1. The storage capacitor Cst stores a signal applied to the gate electrode of the first switching element T1 for one frame period.

The LED emits light corresponding to a driving current applied through the first switching element T1. The LED emits a light having brightness depending on a magnitude of the driving current. An anode electrode of the LED is connected to the fourth node n4, and a cathode electrode of the LED is connected to the low potential line VSL which is another of the power supply lines. The low potential driving voltage ELVSS is applied to this low potential line VSL. The LED may be an organic light emitting diode ("OLED"). The anode electrode of the LED corresponds to a pixel electrode to be described below, and the cathode electrode of the LED corresponds to a common electrode to be described below.

The fourth switching element T4 is turned on when the (n−1)-th scan signal SSn−1 is applied to the (n−1)-th scan line SLn−1. The initializing voltage Vinit is applied to the first node n1 (i.e., the gate electrode of the first switching element T1) through the turned-on fourth switching element T4. Accordingly, the voltage of the gate electrode of the first switching element T1 is initialized.

The second switching element T2 and the third switching element T3 are turned on when the n-th scan signal SSn is applied to the n-th scan line SLn. A data voltage DA is applied to the first node n1 (i.e., the gate electrode of the first switching element T1) through the turned-on second switching element T2, and accordingly, the first switching element T1 is turned on. Thus, a threshold voltage of the first switching element T1 is detected and the threshold voltage is stored in the storage capacitor Cst.

The fifth switching element T5 and the sixth switching element T6 are turned on when the light emission control signal ES is applied to the light emission control line EL. A driving current is applied to the LED through the turned-on fifth switching element T5, the turned-on first switching element T1 and the turned-on sixth switching element T6 such that the LED emits light.

The seventh switching element T7 is turned on when the (n+1)-th scan signal SSn+1 is applied to the (n+1)-th scan line SLn+1. The initializing voltage Vinit is applied to the fourth node n4 (i.e., the anode electrode of the LED) through the turned-on seventh switching element T7. Accordingly, the LED is biased in a reverse direction such that the LED is turned off.

Figure 3:
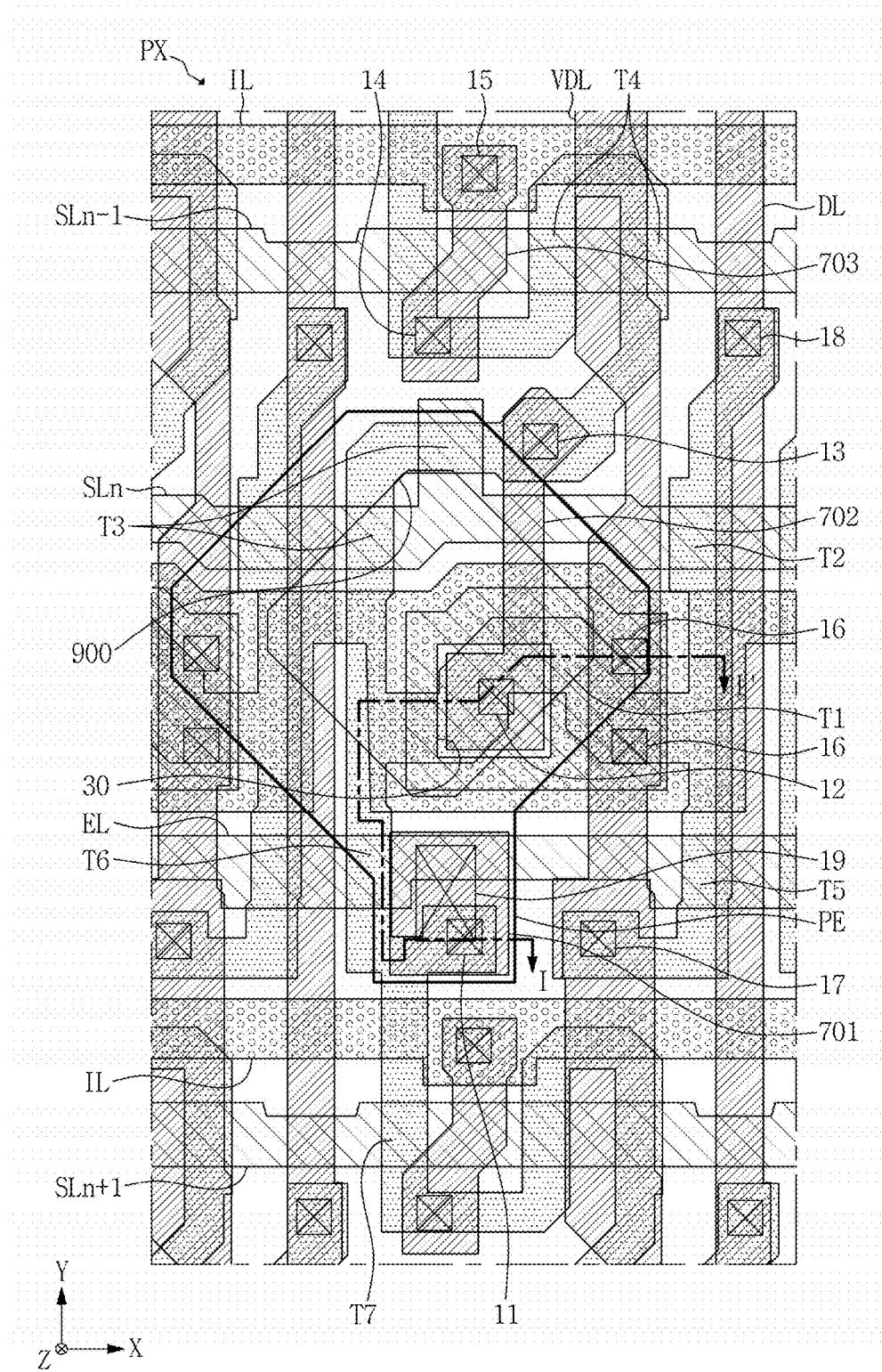
FIG. 3 is a plan view illustrating one pixel and lines connected to the one pixel of a display device illustrated in FIG. 1.
Figure 4A:
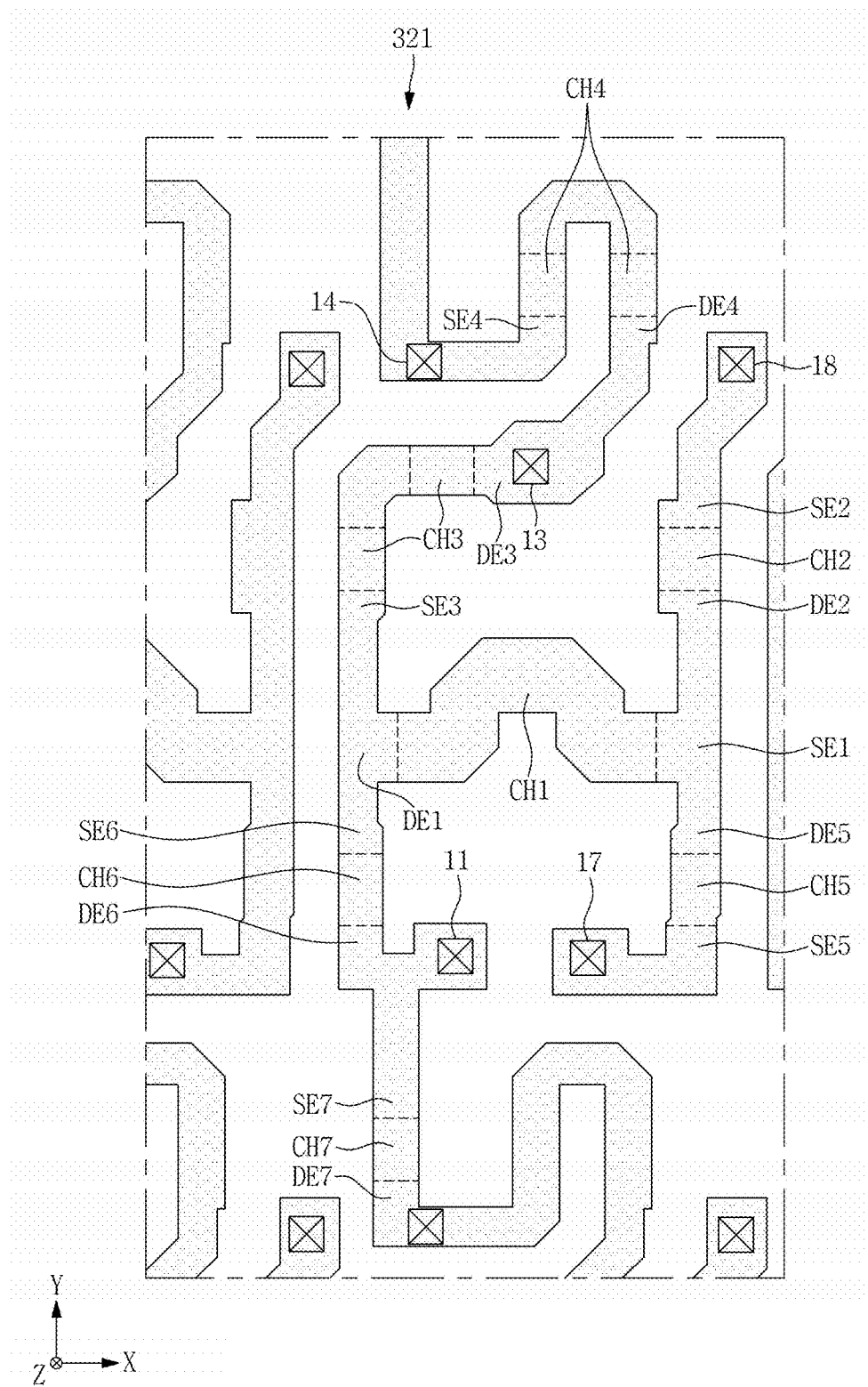
FIGS. 4A to 4G are views illustrating only a part of components of FIG. 3.
Figure 4B:
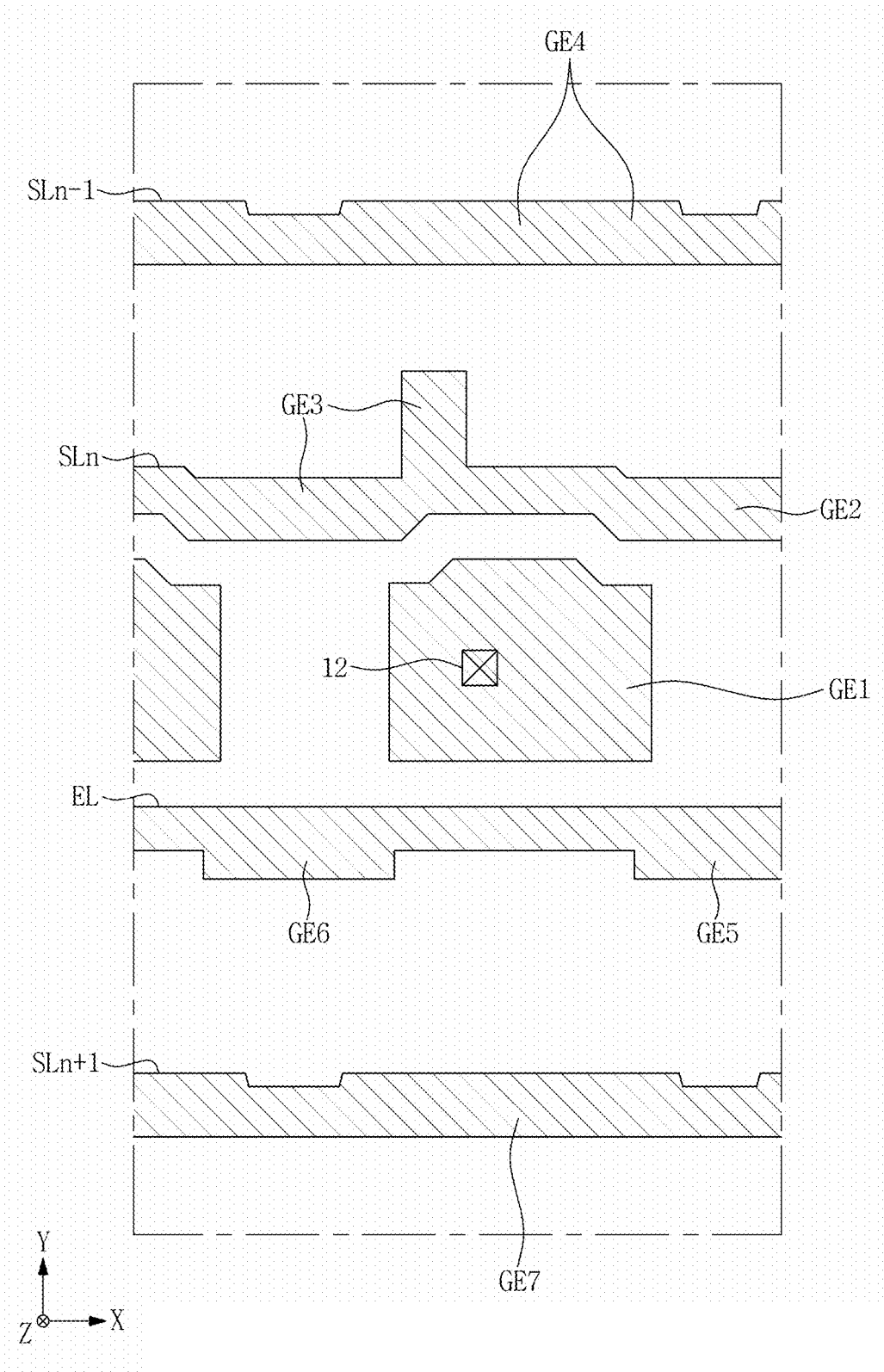
Figure 4C:
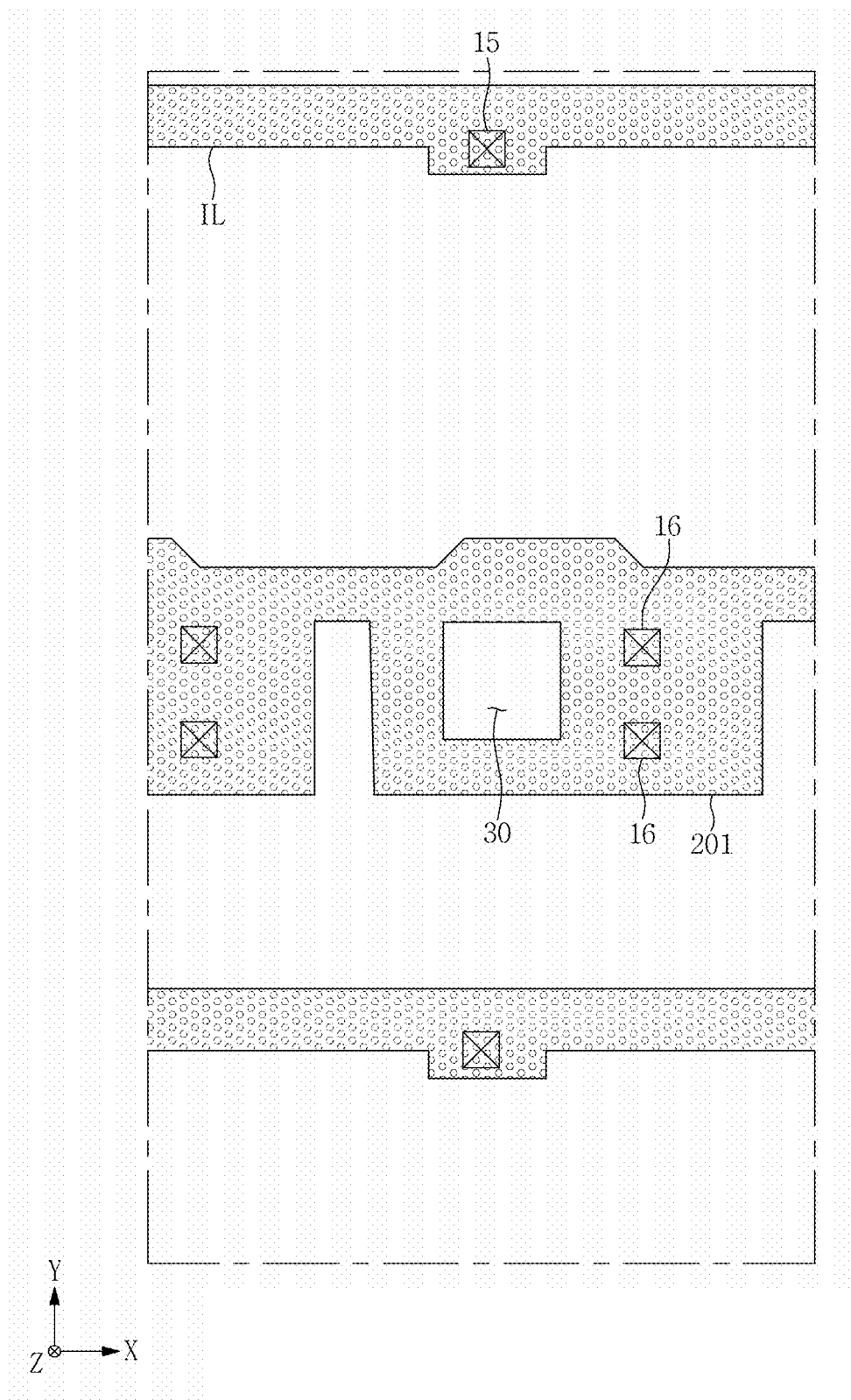
Figure 4D:
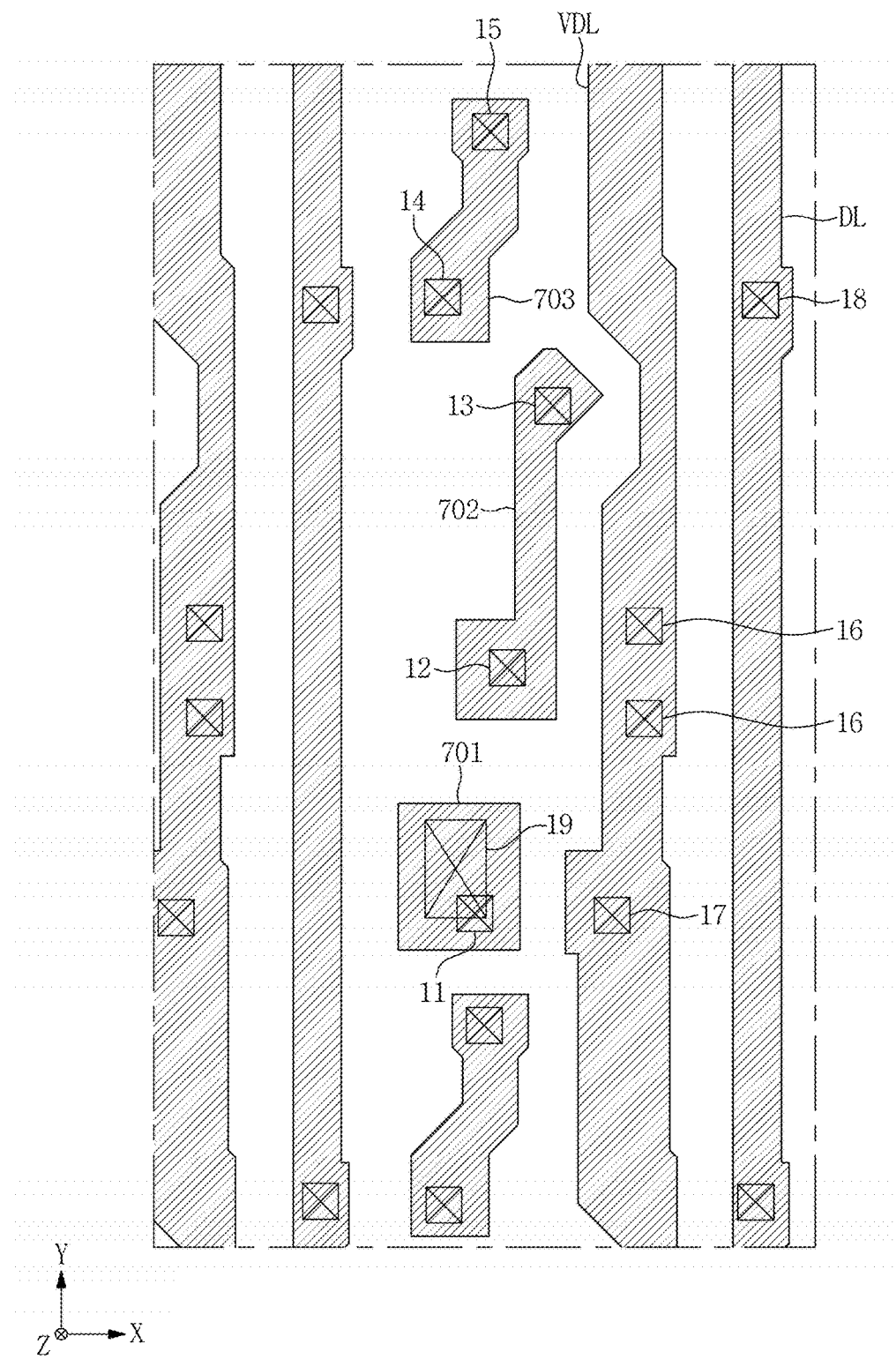
Figure 4E:
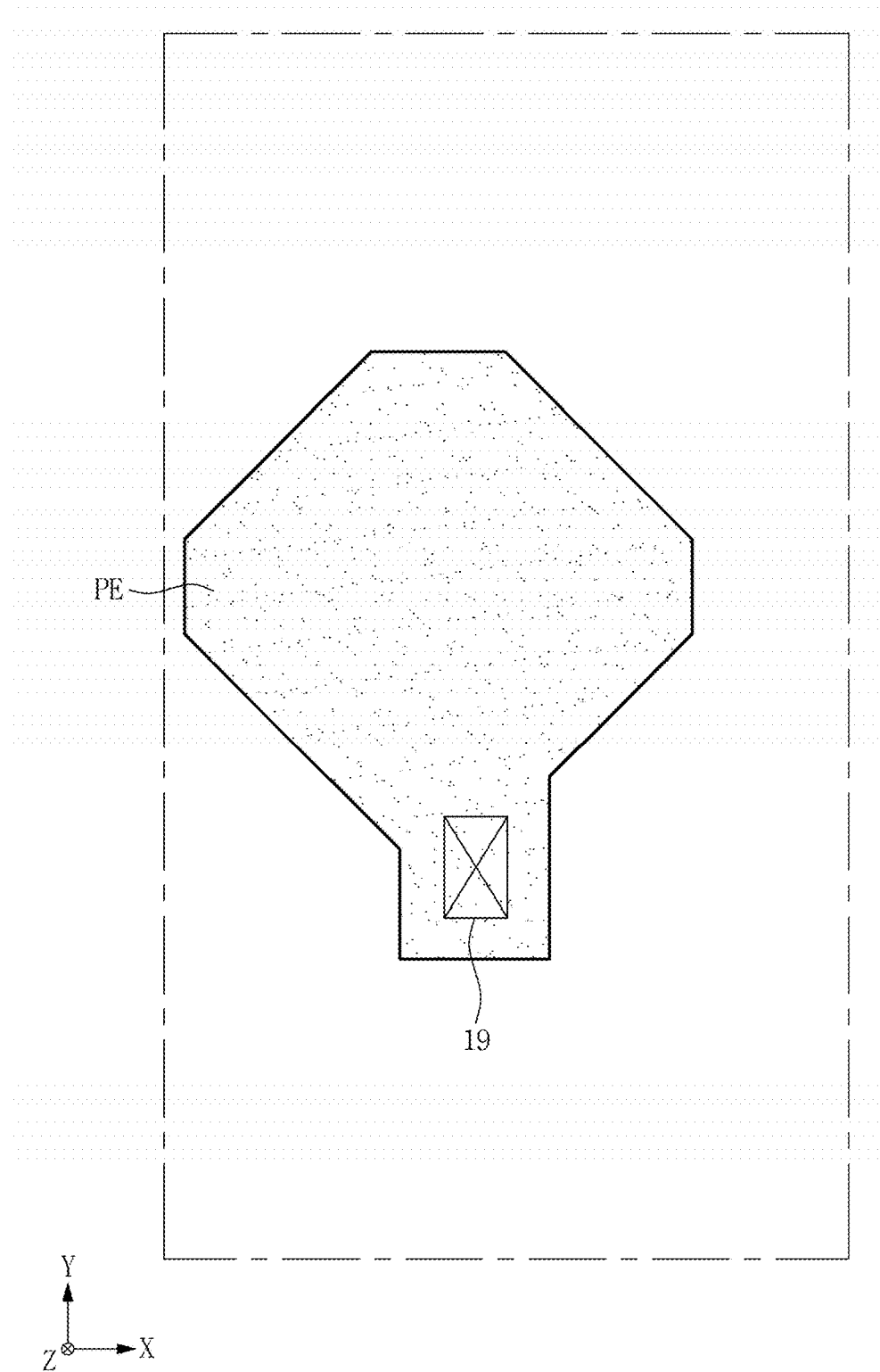
Figure 4F:
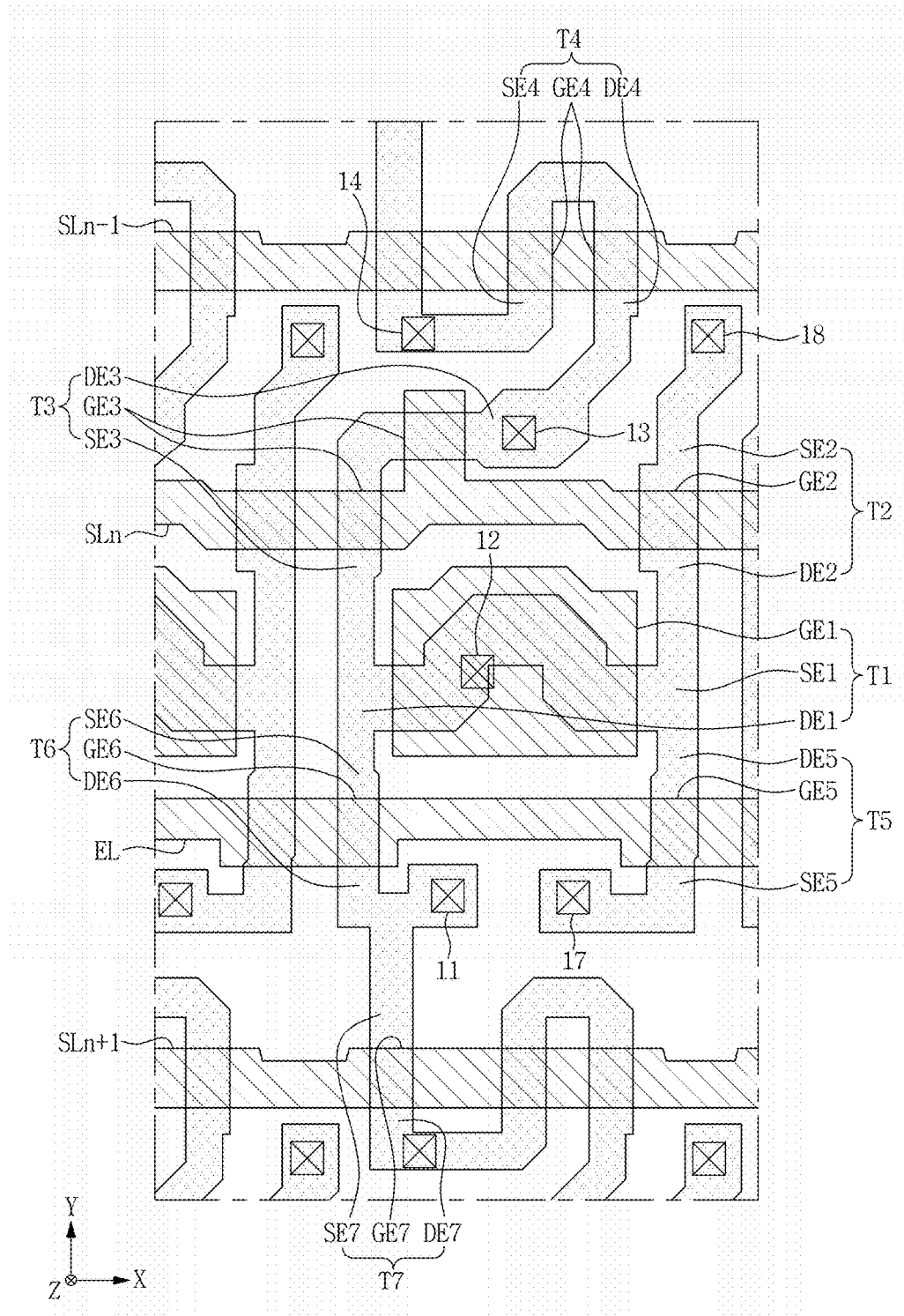
Figure 4G:
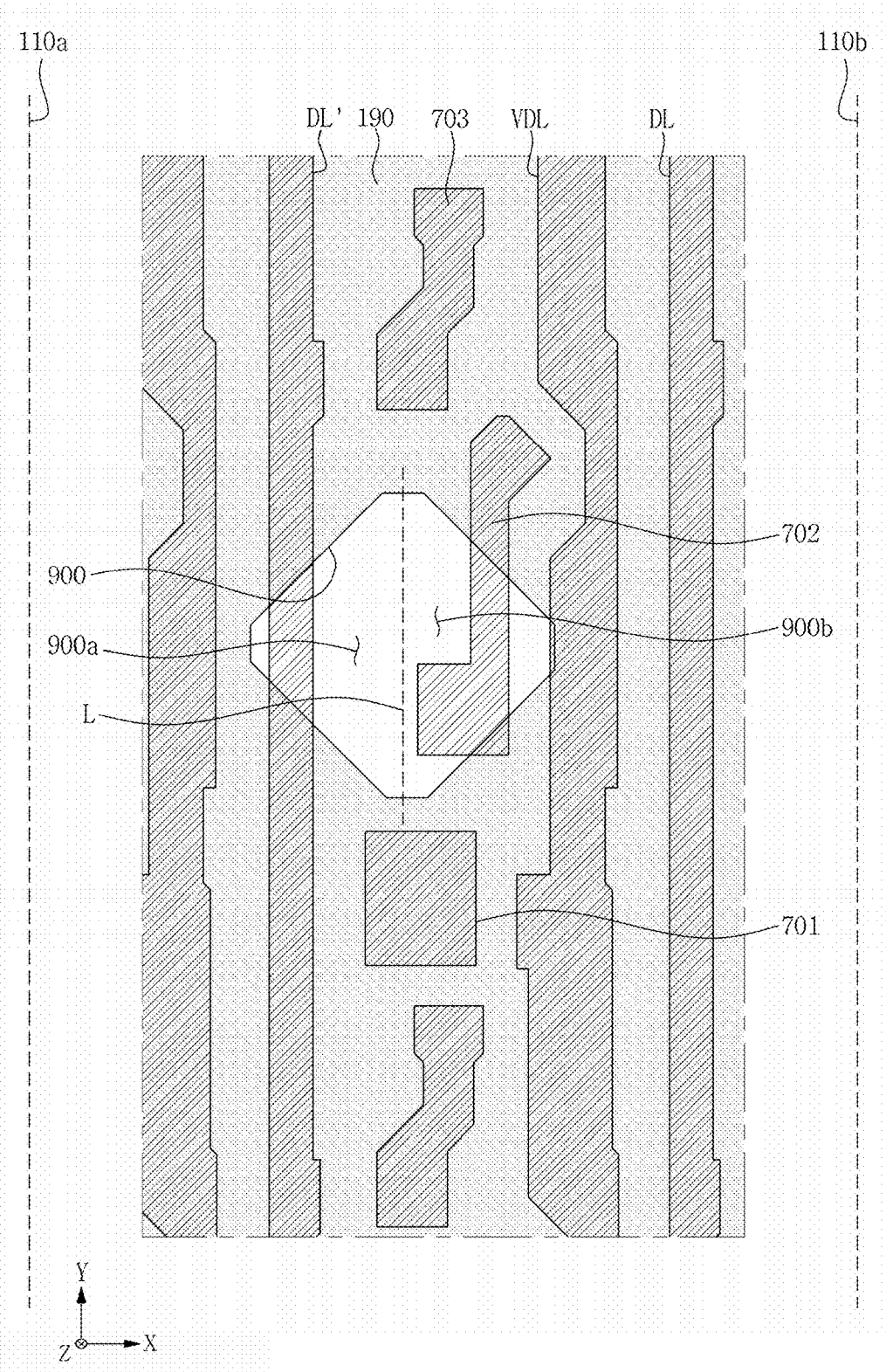
Figure 5:
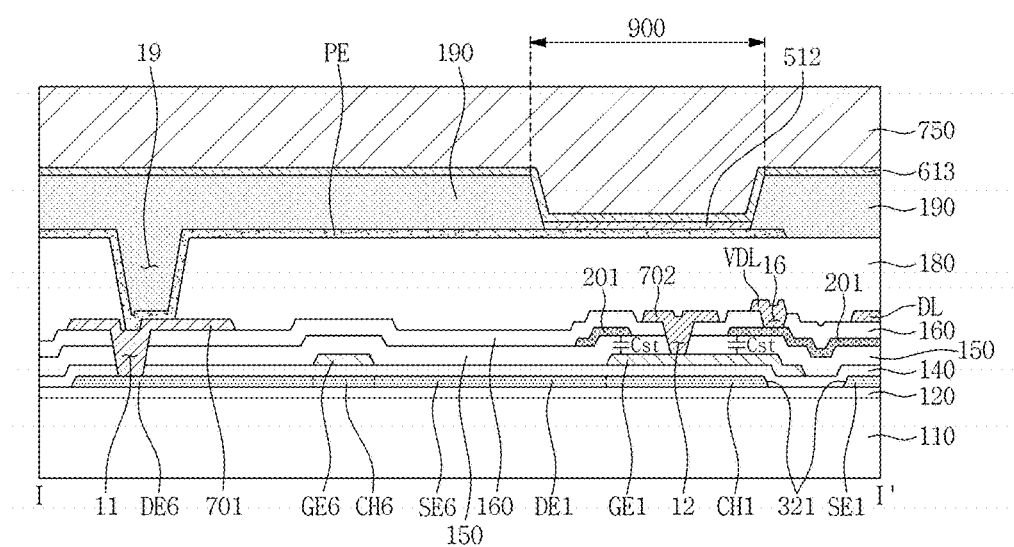
FIG. 5 is a cross-sectional view taken along line I-I' of FIG. 3.

FIG. 3 is a plan view illustrating one pixel and lines connected to the one pixel of a display device illustrated in FIG. 1, FIGS. 4A to 4G are views illustrating only a part of components of FIG. 3, and FIG. 5 is a cross-sectional view taken along line I-I' of FIG. 3.

More particularly, FIG. 4A is a view illustrating a semiconductor layer 321 of FIG. 3, FIG. 4B is a view illustrating the (n−1)-th scan line SLn−1, the n-th scan line SLn, the (n+1)-th scan line SLn+1 and the emission control line EL of FIG. 3, FIG. 4C is a view illustrating the initialization line IL and a capacitor electrode 201 of FIG. 3, FIG. 4D shows the data line DL and the high potential line VDL of FIG. 3, FIG. 4E is a view illustrating the pixel electrode PE of FIG. 3, FIG. 4F is a view illustrating the semiconductor layer 321, the (n−1)-th scan line SLn−1, the n-th scan line SLn, the (n+1)-th scan line SLn+1 and the light emission control line EL of FIG. 3, and FIG. 4G is a view illustrating a connection electrode 701, a second connection electrode 702, a third connection electrode 703, the data line DL, the high potential line VDL and a light blocking layer 190 of FIG. 3.

In an exemplary embodiment, as illustrated in FIGS. 3 and 4A to 5, a display device includes a substrate 110, a buffer layer 120, the semiconductor layer 321, a gate insulating layer 140, a first gate electrode GE1, a second gate electrode GE2, a third gate electrode GE3, a fourth gate electrode GE4, a fifth gate electrode GE5, a sixth gate electrode GE6, a seventh gate electrode GE7, an (n−1)-th scan line SLn−1, an n-th scan line SLn, an (n+1)-th scan line SLn+1, the light emission control line EL, a first insulating interlayer 150, the initialization line IL, the capacitor electrode 201, a second insulating interlayer 160, the first connection electrode 701, the second connection electrode 702, the third connection electrode 703, the data line DL, the high potential line VDL, a planarization layer 180, a pixel electrode PE, the light blocking layer 190, a light emitting layer 512, a common electrode 613 and a sealing member 750.

In such an embodiment, as illustrated in FIGS. 3 and 4F, the first switching element T1 includes the first gate electrode GE1, a first source electrode SE1 and a first drain electrode DE1.

In such an embodiment, as illustrated in FIGS. 3 and 4F, the second switching element T2 includes the second gate electrode GE2, a second source electrode SE2 and a second drain electrode DE2.

In such an embodiment, as illustrated in FIGS. 3 and 4F, the third switching element T3 includes the third gate electrode GE3, a third source electrode SE3 and a third drain electrode DE3.

In such an embodiment, as illustrated in FIGS. 3 and 4F, the fourth switching element T4 includes the fourth gate electrode GE4, a fourth source electrode SE4 and a fourth drain electrode DE4.

In such an embodiment, as illustrated in FIGS. 3 and 4F, the fifth switching element T5 includes the fifth gate electrode GE5, a fifth source electrode SE5 and a fifth drain electrode DE5.

In such an embodiment, as illustrated in FIGS. 3 and 4F, the sixth switching element T6 includes the sixth gate electrode GE6, a sixth source electrode SE6 and a sixth drain electrode DE6.

In such an embodiment, as illustrated in FIGS. 3 and 4F, the seventh switching element T7 includes the seventh gate electrode GE7, a seventh source electrode SE7 and a seventh drain electrode DE7.

In such an embodiment, the substrate 110 may be a transparent insulating substrate including glass or transparent plastic. In one exemplary embodiment, for example, the substrate 110 may include one selected from kapton, polyethersulphone ("PES"), polycarbonate ("PC"), polyimide ("PI"), polyethyleneterephthalate ("PET"), polyethylene naphthalate ("PEN"), polyacrylate ("PAR"), fiber reinforced plastic ("FRP") and the like.

In an exemplary embodiment, as illustrated in FIG. 5, a buffer layer 120 is disposed on the substrate 110. The buffer layer 120 may be disposed over an entire surface of the substrate 110. The buffer layer 120 may effectively prevent permeation of undesirable elements and provides a planarized surface for the layers therebelow, and may include a predetermined material for planarizing and/or preventing permeation. In one exemplary embodiment, for example, the buffer layer 120 may include at least one of a silicon nitride ($SiN_x$) layer, a silicon oxide ($SiO_2$) layer and a silicon oxynitride ($SiO_xN_y$) layer. In an alternative exemplary embodiment, the buffer layer 120 may be omitted depending on the kinds of the substrate 110 and process conditions thereof.

In an exemplary embodiment, as illustrated in FIG. 5, the semiconductor layer 321 is disposed on the buffer layer 120.

In such an embodiment, as illustrated in FIG. 4A, the semiconductor layer 321 provides respective channel areas CH1, CH2, CH3, CH4, CH5, CH6 and CH7 of the first, second, third, fourth, fifth, sixth and seventh switching elements T1, T2, T3, T4, T5, T6 and T7. In addition, the semiconductor layer 321 provides the respective source electrodes SE1, SE2, SE3, SE4, SE5, SE6 and SE7 and the respective drain electrodes DE1, DE2, DE3, DE4, DE5, DE6 and DE7 of the first, second, third, fourth, fifth, sixth and seventh switching elements T1, T2, T3, T4, T5, T6 and T7.

In such an embodiment, the semiconductor layer 321 may include the first channel area CH1, the second channel area CH2, the third channel area CH3, the fourth channel area CH4, the fifth channel area CH5, the sixth channel area CH6, the seventh channel area CH7, the first source electrode SE1, the second source electrode SE2, the third source electrode SE3, the fourth source electrode SE4, the fifth source electrode SE5, the sixth source electrode SE6, the seventh source electrode SE7, the first drain electrode DE1, the second drain electrode DE2, the third drain electrode DE3, the fourth drain electrode DE4, the fifth drain electrode DE5, the sixth drain electrode DE6 and the seventh drain electrode DE7.

The first source electrode SE1, the second drain electrode DE2 and the fifth drain electrode DE5 are connected to each other. In one exemplary embodiment, for example, the first source electrode SE1, the second drain electrode DE2 and the fifth drain electrode DE5 may be integrally formed as a single unitary and indivisible unit.

The first drain electrode DE1, the third source electrode SE3 and the sixth source electrode SE6 are connected to each other. In one exemplary embodiment, for example, the first drain electrode DE1, the third source electrode SE3 and the sixth source electrode SE6 may be integrally formed as a single unitary and indivisible unit.

The third drain electrode DE3 and the fourth drain electrode DE4 are connected to each other. In one exemplary embodiment, for example, the third drain electrode DE3 and the fourth drain electrode DE4 may be integrally formed as a single unitary and indivisible unit.

The sixth drain electrode DE6 and the seventh source electrode SE7 are connected to each other. In one exemplary embodiment, for example, the sixth drain electrode DE6 and the seventh source electrode SE7 may be integrally formed as a single unitary and indivisible unit.

The semiconductor layer 321 may include at least one of a polycrystalline silicon film, an amorphous silicon film and an oxide semiconductor, such as indium-gallium-zinc oxide ("IGZO") or indium zinc tin oxide ("IZTO"). In one exemplary embodiment, for example, where the semiconductor layer 321 includes a polycrystalline silicon film, the semiconductor layer 321 may include a channel area which is not doped with an impurity, and a source electrode and a drain electrode, on the opposite sides of the channel area, which are doped with impurities.

In an exemplary embodiment, as illustrated in FIG. 5, the gate insulating layer 140 is disposed on the semiconductor layer 321 and the buffer layer 120. The gate insulating layer 140 may include at least one of tetraethylorthosilicate ("TEOS"), silicon nitride ($SiN_x$) and silicon oxide ($SiO_2$). In one exemplary embodiment, for example, the gate insulating layer 140 may have a double-layer structure where a $SiN_x$ layer having a thickness of about 40 nanometers (nm) and a TEOS layer having a thickness of about 80 nm are sequentially stacked one on another.

In an exemplary embodiment, as illustrated in FIG. 5, the first gate electrode GE1 is disposed on the gate insulating layer 140. In one exemplary embodiment, for example, the first gate electrode GE1 is disposed between the gate insulating layer 140 and the first insulating interlayer 150.

Although not illustrated in FIG. 5, the second gate electrode GE2, the third gate electrode GE3, the fourth gate electrode GE4, the fifth gate electrode GE5, the sixth gate electrode GE6 and the seventh gate electrode GE 7 are also disposed on the gate insulating layer 140. In one exemplary embodiment, for example, the second, third, fourth, fifth, sixth and seventh gate electrodes GE2, GE3, GE4, GE5, GE6 and GE7 are disposed between the gate insulating layer 140 and the first insulating interlayer 150.

Although not illustrated in FIG. 5, the scan lines and the light emission control lines are also disposed on the gate insulating layer 140. In one exemplary embodiment, for example, the (n−1)-th scan line SLn−1, the n-th scan line SLn, the (n+1)-th scan line SLn+1 and the light emission control line EL are disposed between the gate insulating layer 140 and the first insulating interlayer 150.

In an exemplary embodiment, as illustrated in FIGS. 3 and 4F, the first gate electrode GE1 overlaps the first channel area CH1 of the semiconductor layer 321, the second gate electrode GE2 overlaps the second channel area CH2 of the semiconductor layer 321, the third gate electrode GE3 overlaps the third channel area CH3 of the semiconductor layer 321, the fourth gate electrode GE4 overlaps the fourth channel area CH4 of the semiconductor layer 321, the fifth gate electrode GE5 overlaps the fifth channel area CH5 of the semiconductor layer 321, the sixth gate electrode GE6 overlaps the sixth channel area CH6 of the semiconductor layer 321 and the seventh gate electrode GE7 overlaps the seventh channel area CH7 of the semiconductor layer 321.

In an exemplary embodiment, as illustrated in FIGS. 4B and 4F, the fourth gate electrode GE4 is connected to the (n−1)-th scan line SLn−1, and the fourth gate electrode GE4 may be defined by a portion of the (n−1)-th scan line SLn−1. In one exemplary embodiment, for example, a portion of the (n−1)-th scan line SLn−1 that overlaps the semiconductor layer 321 may define the fourth gate electrode GE4.

In an exemplary embodiment, as illustrated in FIGS. 4B and 4F, the third gate electrode GE3 is connected to the n-th scan line SLn, and the third gate electrode GE3 may be defined by a portion of the n-th scan line SLn. In one exemplary embodiment, for example, a portion of the n-th scan line SLn that overlaps the semiconductor layer 321 may define the third gate electrode GE3.

In an exemplary embodiment, as illustrated in FIGS. 4B and 4F, the seventh gate electrode GE7 is connected to the (n+1)-th scan line SLn+1, and the seventh gate electrode GE7 may be defined by a portion of the (n+1)-th scan line SLn+1. In one exemplary embodiment, for example, a portion of the (n+1)-th scan line SLn+1 that overlaps the semiconductor layer 321 may define the seventh gate electrode GE7.

In an exemplary embodiment, as illustrated in FIGS. 4B and 4F, the fifth gate electrode GE5 and the sixth gate electrode GE6 are connected in common to one light emission control line EL, and the fifth gate electrode GE5 and the sixth gate electrode GE6 may be defined by portions of the light emission control line EL, respectively. In one exemplary embodiment, for example, two portions of the light emission control line EL overlapping the semiconductor layer 321 may define the fifth gate electrode GE5 and the sixth gate electrode GE6, respectively.

The scan line (e.g., at least one of the (n−1)-th scan line SLn−1, the n-th scan line SLn and the (n+1)-th scan line SLn+1) may include at least one of aluminum (Al) or alloys thereof, silver (Ag) or alloys thereof, copper (Cu) or alloys thereof, and molybdenum (Mo) or alloys thereof. Alternatively, the scan line may include chromium (Cr), tantalum (Ta), and/or titanium (Ti). In an exemplary embodiment, the scan line may have a multilayer structure including at least two conductive layers that have different physical properties from each other.

The first, second, third, fourth, fifth, sixth and seventh gate electrodes GE1, GE2, GE3, GE4, GE5, GE6 and GE7 may include a substantially same material and have a substantially same structure (e.g., a multilayer structure) as those of the scan line described above. Each of the gate electrodes GE1, GE2, GE3, GE4, GE5, GE6 and GE7 and the scan line may be substantially simultaneously formed in a substantially same process.

In an exemplary embodiment, the light emission control line EL may include a substantially same material and have a substantially same structure (e.g., a multilayer structure) as those of the above-described scan line. The light emission control line EL and the scan line may be substantially simultaneously formed in a substantially same process.

In an exemplary embodiment, as illustrated in FIG. 5, the first insulating interlayer 150 is disposed on the first gate electrode GE1 and the gate insulating layer 140. The first insulating interlayer 150 may have a thickness greater than a thickness of the gate insulating layer 140. The first insulating interlayer 150 may include a material substantially the same as a material included in the gate insulating layer 140 described above.

Although not illustrated in FIG. 5, the first insulating interlayer 150 is also disposed on the second, third, fourth, fifth, sixth and seventh gate electrodes GE2, GE3, GE4, GE5, GE6 and GE7, each scan line (e.g., scan lines SLn−1, SLn, SLn+1) and the light emission control line EL.

In an exemplary embodiment, as illustrated in FIG. 5, the capacitor electrode 201 is disposed on the first insulating interlayer 150. In one exemplary embodiment, for example, the capacitor electrode 201 is disposed between the first insulating interlayer 150 and the second insulating interlayer 160. The capacitor electrode 201 forms a storage capacitor Cst together with the first gate electrode GE1 described above. In one exemplary embodiment, for example, the first gate electrode GE1 corresponds to a first electrode of the storage capacitor Cst and the capacitor electrode 201 corresponds to a second electrode of the storage capacitor Cst. In one exemplary embodiment, for example, a portion of the first gate electrode GE1 overlapping the capacitor electrode 201 corresponds to the first electrode of the storage capacitor Cst and a portion of the capacitor electrode 201 overlapping the first gate electrode GE1 corresponds to the second electrode of the storage capacitor Cst.

Although not illustrated in FIG. 5, the initialization line IL (see FIGS. 3 and 4C) is also disposed on the first insulating interlayer 150. In one exemplary embodiment, for example, the initialization line IL is disposed between the first insulating interlayer 150 and the second insulating interlayer 160.

In such an embodiment, as illustrated in FIGS. 3 and 4C, a hole 30 is defined through the capacitor electrode 201. The hole 30 may have a quadrangular shape. However, the shape of the hole is not limited to the quadrangle. In one alternative exemplary embodiment, for example, the holes 30 may have at least one of various shapes such as circular or triangular shape.

In an exemplary embodiment, as illustrated in FIGS. 3 and 4C, capacitor electrodes 201 of pixels adjacent to each other may be connected to each other. In such an embodiment, the capacitor electrodes 201 of the pixels adjacent in the x-axis direction may be integrally formed as a single unitary and indivisible unit.

In an exemplary embodiment, as illustrated in FIG. 5, the second insulating interlayer 160 is disposed on the capacitor electrode 201, the initialization line IL and the first insulating interlayer 150. The second insulating interlayer 160 may have a thickness greater than a thickness of the gate insulating layer 140. The second insulating interlayer 160 may include a material substantially the same as a material included in the gate insulating layer 140 described above.

In an exemplary embodiment, as illustrated in FIG. 5, the first connection electrode 701, the second connection electrode 702, the high potential line VDL and the data line DL are disposed on the second insulating interlayer 160. In one exemplary embodiment, for example, the first connection electrode 701, the second connection electrode 702, the high potential line VDL and the data line DL are disposed between the second insulating interlayer 160 and the planarization layer 180.

Although not illustrated in FIG. 5, the third connection electrode 703 (see FIGS. 3 and 4D) is also disposed on the second insulating interlayer 160. In one exemplary embodiment, for example, the third connection electrode 703 is disposed between the second insulating interlayer 160 and the planarization layer 180.

In an exemplary embodiment, as illustrated in FIG. 5, the first connection electrode 701 is connected to the first source electrode SE1 through a first contact hole 11 defined through the second insulating interlayer 160, the first insulating interlayer 150 and the gate insulating layer 140.

In an exemplary embodiment, as illustrated in FIG. 5, the second connection electrode 702 is connected to the first gate electrode GE1 through a second contact hole 12 defined through the second insulating interlayer 160 and the first insulating interlayer 150. In such an embodiment, as illustrated in FIGS. 3, 4A and 4D, the second connection electrode 702 is connected to the third drain electrode DE3 through a third contact hole 13. The third contact hole 13 is defined through the second insulating interlayer 160, the first insulating interlayer 150 and the gate insulating layer 140 to expose the third drain electrode DE3.

In an exemplary embodiment, as illustrated in FIGS. 3, 4A and 4D, the third connection electrode 703 is connected to the fourth source electrode SE4 through a fourth contact hole 14. The fourth contact hole 14 is defined through the second insulating interlayer 160, the first insulating interlayer 150 and the gate insulating layer 140 to expose the fourth source electrode SE4. In such an embodiment, as illustrated in FIGS. 3, 4C and 4D, the third connection electrode 703 is connected to the initialization line IL through a fifth contact hole 15. The fifth contact hole 15 is defined through the second insulating interlayer 160 to expose the initialization line IL.

In such an embodiment, as illustrated in FIG. 5, the high potential line VDL is connected to the capacitor electrode 201 through a sixth contact hole 16 defined through the second insulating interlayer 160. In such an embodiment, as illustrated in FIGS. 3, 4A and 4D, the high potential line VDL is connected to the fifth source electrode SE5 through a seventh contact hole 17. The seventh contact hole 17 is defined through the second insulating interlayer 160, the first insulating interlayer 150 and the gate insulating layer 140 to expose the fifth source electrode SE5.

In an exemplary embodiment, as illustrated in FIGS. 3, 4A and 4D, the data line DL is connected to the second source electrode SE2 through an eighth contact hole 18. The eighth contact hole 18 is defined through the second insulating interlayer 160, the first insulating interlayer 150 and the gate insulating layer 140 to expose the second source electrode SE2.

The data line DL may include a refractory metal, such as molybdenum, chromium, tantalum and titanium, or an alloy thereof. The data line DL may have a multilayer structure including a refractory metal layer and a low-resistance conductive layer. In such an embodiment, the data line DL having the multilayer structure may have a double-layer structure including a chromium or molybdenum (alloy) lower layer and an aluminum (alloy) upper layer; or a triple-layer structure including a molybdenum (alloy) lower layer, an aluminum (alloy) intermediate layer and a molybdenum (alloy) upper layer. In an exemplary embodiment, the data line DL may include any suitable metals or conductors other than the aforementioned materials.

The first connection electrode 701, the second connection electrode 702, the third connection electrode 703 and the high potential line VDL may include a substantially same material and have a substantially same structure (e.g., a multilayer structure) as those of the data line DL. Each of the first connection electrode 701, the second connection electrode 702, the third connection electrode 703 and the high potential line VDL may be substantially simultaneously formed in a substantially same process.

In such an embodiment, as illustrated in FIG. 5, the planarization layer 180 is disposed on the first connection electrode 701, the second connection electrode 702, the third connection electrode 703, the high potential line VDL and the data line DL.

The planarization layer 180 may planarize a surface therebelow to increase luminous efficiency of the LED disposed thereon by eliminating a step difference on the substrate 110. The planarization layer 180 may include at least one of a polyacrylate resin, an epoxy resin, a phenolic resin, a polyamide resin, a polyimide resin, an unsaturated polyester resin, a polyphenylen ether resin, a polyphenylene sulfide resin and benzocyclobutene ("BCB").

In such an embodiment, as illustrated in FIG. 5, the pixel electrode PE is disposed on the planarization layer 180. A portion of or all of the pixel electrode PE is disposed in a light emission area 900. In such an embodiment, the pixel electrode PE is disposed corresponding to the light emission area 900 defined by the light blocking layer 190 to be described below. The pixel electrode PE is connected to the first connection electrode 701 through a ninth contact hole 19 defined through the planarization layer 180.

In an exemplary embodiment, as illustrated in FIGS. 3 and 4E, the pixel electrode PE may have a rhombic shape. Alternatively, the pixel electrode PE may have one of various shapes, e.g., a quadrangular shape, other than the rhombic shape.

In an exemplary embodiment, as illustrated in FIG. 5, the light blocking layer 190 is disposed on the pixel electrode PE and the planarization layer 180. In such an embodiment, an opening 900 is defined through the light blocking layer 190, and the opening 900 corresponds to the light emission area 900. In such an embodiment, as illustrated in FIGS. 3 and 4G, the light emission area 900 may have a rhombic shape. The light emission area 900 may have one of various shapes, e.g., a quadrangular shape, rather than the rhombic shape. A size of the light emission area 900 may be less than a size of the pixel electrode PE described above. At least a portion of the pixel electrode PE is disposed in the light emission area 900. In such an embodiment, the entire light emission area 900 overlaps the pixel electrode PE.

The light blocking layer 190 may include a resin, such as a polyacrylate resin and a polyimide resin.

The light emitting layer 512 is disposed on the pixel electrode PE in the light emission area 900, and the common electrode 613 is disposed on the light blocking layer 190 and the light emitting layer 512. The pixel electrode PE, the light emitting layer 512 and the common electrode 613 constitute a light emitting element (e.g., the LED in FIG. 2), and in such an embodiment, the pixel electrode PE corresponds to the anode electrode of the LED and the common electrode 613 corresponds to the cathode electrode of the LED.

The light emitting layer 512 may include a low molecular weight organic material or a high molecular weight organic material. Although not illustrated, at least one of a hole injection layer and a hole transport layer may further be provided between the pixel electrode PE and the light emitting layer 512, and at least one of an electron transport layer and an electron injection layer may further be provided between the light emitting layer 512 and the common electrode 613.

The pixel electrode PE and the common electrode 613 may be one of a transmissive electrode, a transflective electrode and a reflective electrode.

In an exemplary embodiment, a transparent conductive oxide ("TCO") may be used to form a transmissive electrode. Such TCO may include at least one selected indium tin oxide ("ITO"), indium zinc oxide ("IZO"), zinc oxide (ZnO) or indium oxide ($In_2O_3$)

In an exemplary embodiment, a metal, e.g., magnesium (Mg), silver (Ag), gold (Au), calcium (Ca), lithium (Li), chromium (Cr), aluminum (Al) and copper (Cu), or an alloy thereof may be used to form a transflective electrode and a reflective electrode. In such an embodiment, whether an electrode is a transflective type or a reflective type depends on the thickness of the electrode. Typically, the transflective electrode has a thickness of about 200 nm or less, and the reflective electrode has a thickness of about 300 nm or more. As the thickness of the transflective electrode decreases, light transmittance and resistance increase. On the contrary, as the thickness of the transflective electrode increases, light transmittance decreases.

In such an embodiment, the transflective electrode and the reflective electrode may have a multilayer structure which includes a metal layer including a metal or a metal alloy and a TCO layer stacked on the metal layer.

In an exemplary embodiment, as illustrated in FIG. 5, the sealing member 750 is disposed on the common electrode 613. The sealing member 750 may include a transparent insulating substrate including glass, transparent plastic, or the like. In such an embodiment, the sealing member 750 may be formed to have a thin film encapsulation structure in which one or more inorganic layers and one or more organic layers are alternately laminated along the z-axis direction, which is perpendicular to the x-axis direction and the y-axis direction.

In an exemplary embodiment, as illustrated in FIG. 5, a plurality of patterns are defined on vertically different layers between the substrate 110 and the pixel electrodes PE. In one exemplary embodiment, for example, the plurality of patterns are disposed on different layers along the z-axis direction between the substrate 110 and the pixel electrode PE, which will be described in detail below.

In an exemplary embodiment, as, the semiconductor layer 321 of FIG. 4A is defined as a first pattern; each of the scan lines SLn−1, SLn, SLn+1, each of the gate electrodes GE1, GE2, GE3, GE4, GE5, GE6 and GE7 and the light emission control line EL of FIG. 4B are defined as a second pattern; the initialization line IL and the capacitor electrode 201 of FIG. 4C are defined as a third pattern; and each of the connection electrodes 701, 702 and 703, the high potential line VDL and the data line DL of FIG. 4D are defined as a fourth pattern.

In such an embodiment, the first pattern includes the semiconductor layer 321, the second pattern includes each of the scan lines SLn−1, SLn, SLn+1, each of the gate electrodes GE1, GE2, GE3, GE4, GE5, GE6 and GE7 and the light emission control line EL, the third pattern includes the initialization line IL and the capacitor electrode 201, and the fourth pattern includes each of the connection electrodes 701, 702 and 703, the high potential line VDL and the data line DL.

Components included in a same pattern all include a substantially same material and are disposed directly on a substantially same layer. Components included in different patterns are disposed on different layers, respectively. In one exemplary embodiment, for example, the semiconductor layer 321 included in the first pattern is disposed on a layer different from a layer on which the light emission control line EL included in the second pattern is disposed. In one exemplary embodiment, for example, the light emission control line EL is disposed on a layer higher than a layer on which the semiconductor layer 321 is disposed (e.g., a layer closer to the pixel electrode PE).

The fourth pattern of the first, second, third and fourth patterns described above is closest to the pixel electrode PE. In such an embodiment, the fourth pattern of the first, second, third and fourth patterns is disposed on a highest layer. Accordingly, the fourth pattern of the first, second, third and fourth patterns is closest to the light emission area 900 of the light blocking layer 190.

In an exemplary embodiment, as illustrated in FIG. 4G, at least a part of the components included in the fourth pattern overlap the light emission area 900. In such an embodiment, at least a part of the components of the fourth pattern are disposed in the light emission area 900.

The light emission area 900 may be divided into a plurality of divided areas. In one exemplary embodiment, for example, as illustrated in FIG. 4G, the light emission area 900 may include a first divided area 900a and a second divided area 900b. The first divided area 900a and the second divided area 900b may have a substantially equal size as each other.

In an exemplary embodiment, as illustrated in FIG. 4G, the light emission area 900 may be divided into two divided areas 900a and 900b by an imaginary division line L. The division line L is parallel to the data line DL and passes through a center of the light emission area 900. In one exemplary embodiment, for example, the division line L is parallel to the y-axis and passes through the center of the light emission area 900. The first divided area 900a and the second divided area 900b may have a symmetrical shape with respect to the division line L. In an exemplary embodiment, the first divided area 900a and the second divided area 900b may have different shapes.

In an exemplary embodiment, as illustrated in FIG. 4G, facing sides of the substrate 110 may be defined as a first side 110a and a second side 110b, respectively. As used herein, the first side 110a and the second side 110b are sides substantially parallel to the data line DL, and each of the first side 110a and the second side 110b extends in the y-axis direction.

The first divided area 900a is located between the division line L and the first side 110a and the second divided area 900b is located between the division line L and the second side 110b. In such an embodiment, the first divided area 900a of the first divided area 900a and the second divided area 900b may be closer to the first side 110a.

In one exemplary embodiment, for example, when a shortest distance from a specific point (hereinafter, referred to as "a first point") of the first divided area 900a to the first side 110a is defined as a first distance and a shortest distance from a specific point (hereinafter, referred to as "a second point") of the second divided area 900b to the first side 110a is defined as a second distance, the first distance is shorter than the second distance. In such an embodiment, the first point and the second point are located at portions except for a boundary portion between the first and second divided areas 900a and 900b. In such an embodiment, the first distance and the second distance are distances measured along the x-axis direction.

In an exemplary embodiment, the second divided area 900b of the first divided area 900a and the second divided area 900b is closer to the second side 110b. In one exemplary embodiment, for example, where a shortest distance from a specific point (hereinafter, referred to as "a third point") of the first divided area 900a to the second side 110b is defined as a third distance, and a shortest distance from a specific point (hereinafter, referred to as "a fourth point") of the second divided area 900b to the second side 110b is defined as a fourth distance, the fourth distance is shorter than the third distance. In such an embodiment, the third point and the fourth point are located at portions except for a boundary portion between the first and second divided areas 900a and 900b. In such an embodiment, the third distance and the fourth distance are distances measured along the x-axis direction.

An overlap area (hereinafter, referred to as "a first overlap area") between the first divided area 900a of the first light emission area 900 and the fourth pattern is different from an overlap area (hereinafter, referred to as "a second overlap area") between the second divided area 900b of the first light emission area 900 and the fourth pattern. In one exemplary embodiment, for example, as illustrated in FIG. 4G, the second overlap area may be larger than the first overlap area. Alternatively, although not illustrated, the first overlap area may be larger than the second overlap area. Herein, an overlap area between two elements is an area of portions overlapping with each other when viewed from a plan view in a thickness direction of the substrate 110 or the z-axis direction.

In an exemplary embodiment, as illustrated in FIG. 4G, a portion of the data line DL' is located in the first divided area 900a of the second light emission area 902, and a portion of the second connection electrode 702 and a portion of the high potential line VDL are located in the second divided area 900b of the second light emission area 902. In such an embodiment, the portion of the second connection electrode 702 and the portion of the high potential line VDL overlapping the second divided area 900b has a planar area larger than a planar area of a portion of the data line DL' overlapping the first divided area 900a.

Figure 6:
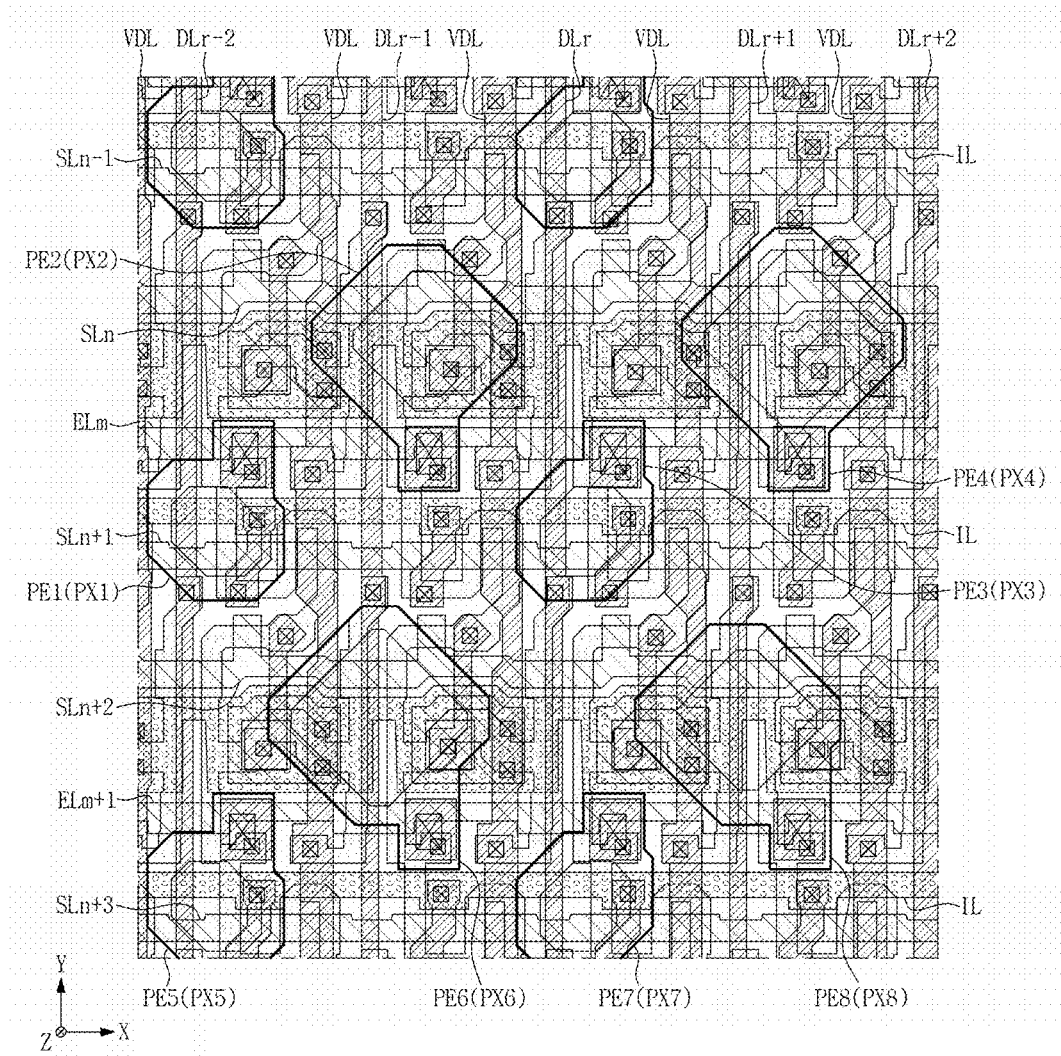
FIG. 6 is a detailed plan view illustrating a display device including a plurality of pixels and lines connected to the plurality of pixels illustrated in FIG. 1.

FIG. 6 is a plan view illustrating a display device including a plurality of pixels and lines connected to the plurality of pixels illustrated in FIG. 1, and FIGS. 7A to 7G are views illustrating only a part of components of FIG. 6.

Figure 7A:
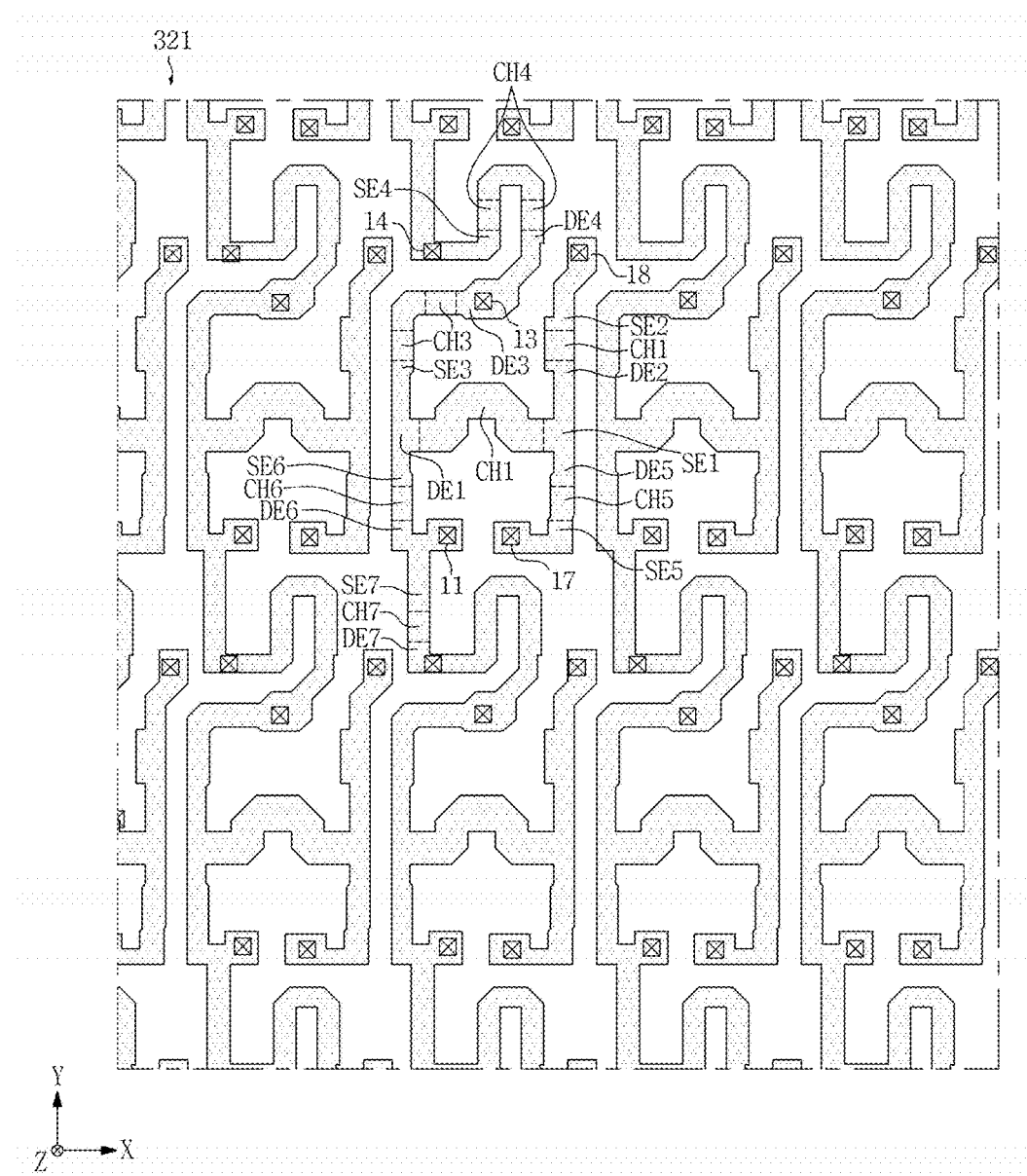
FIGS. 7A to 7G are views illustrating only a part of components of FIG. 6.
Figure 7B:
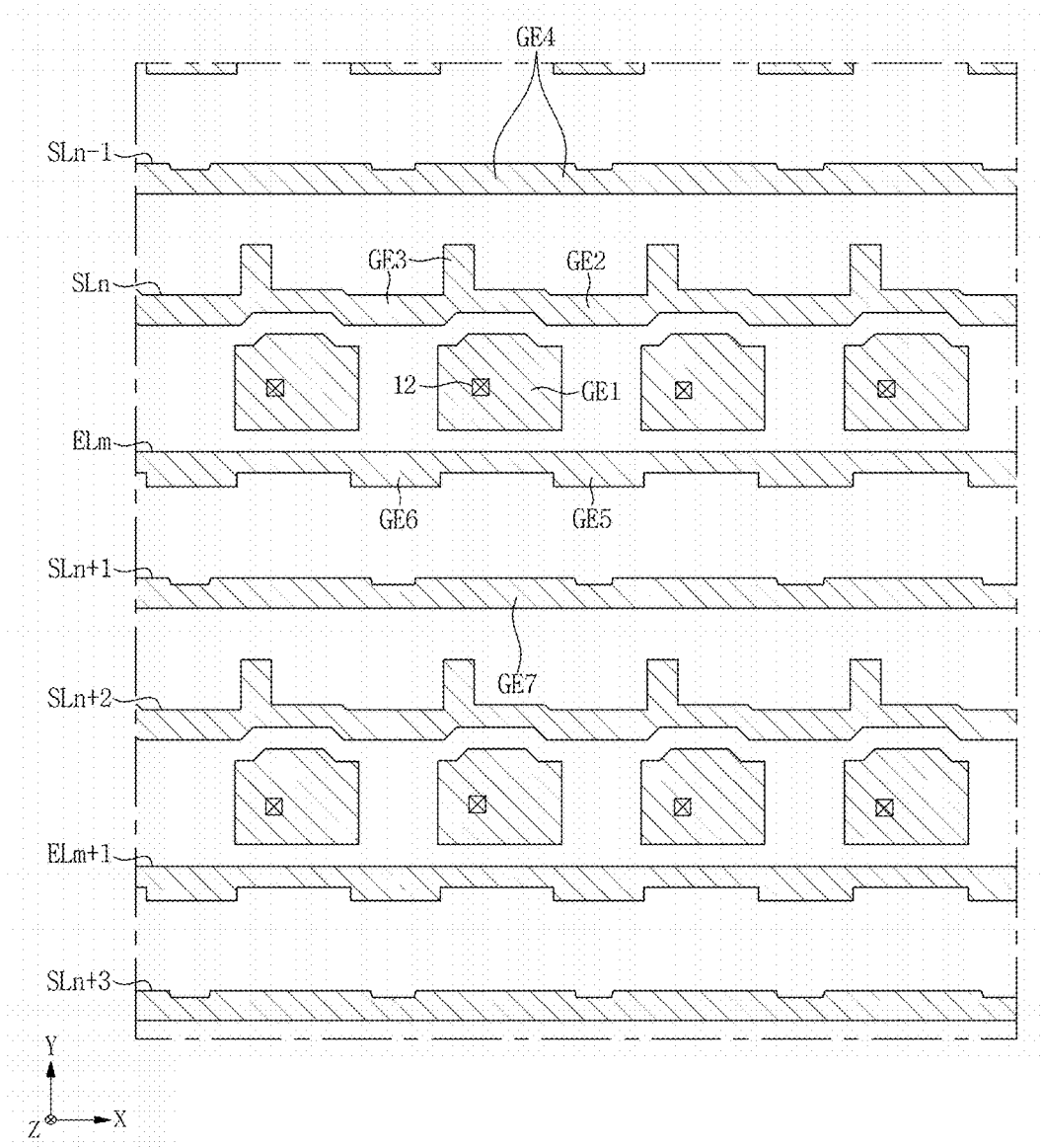
Figure 7C:
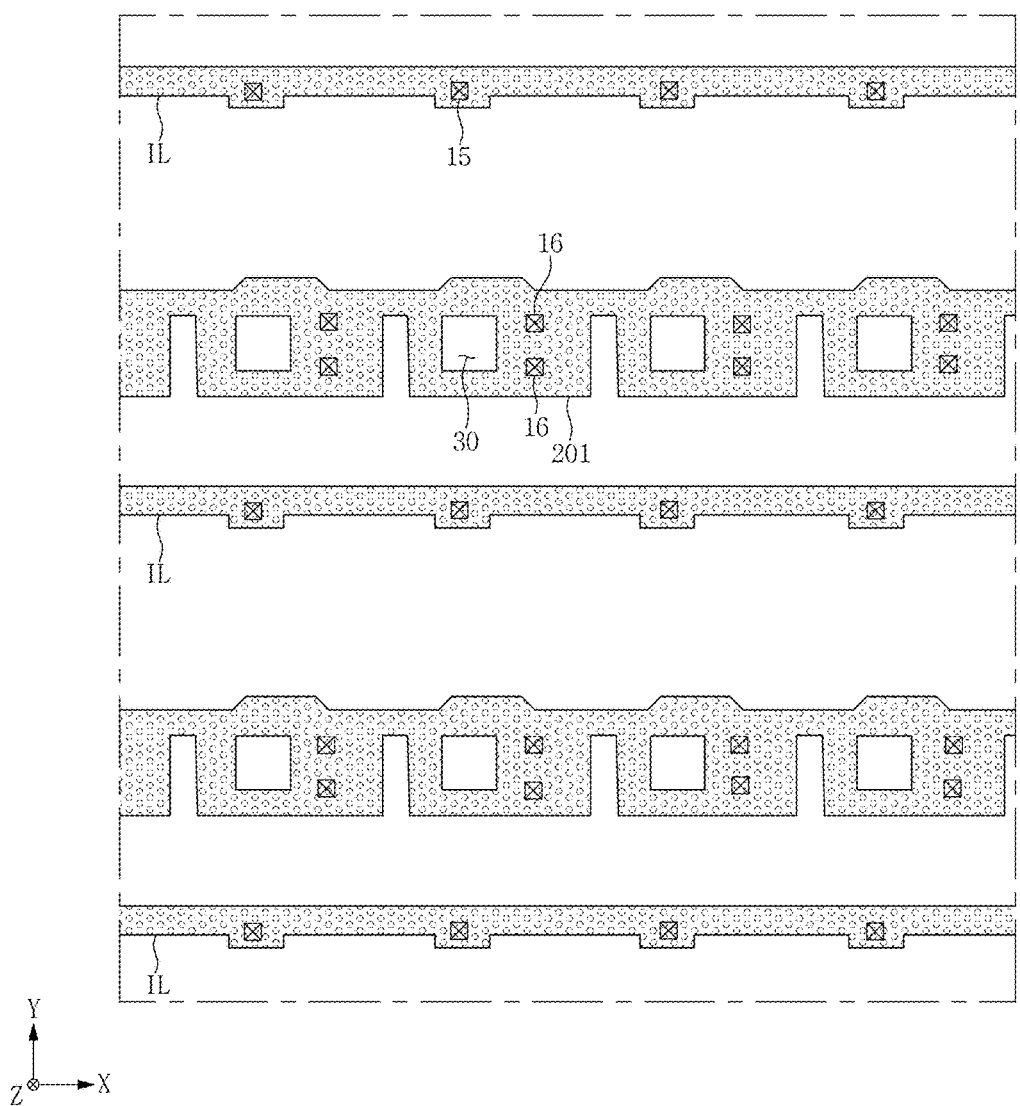
Figure 7D:
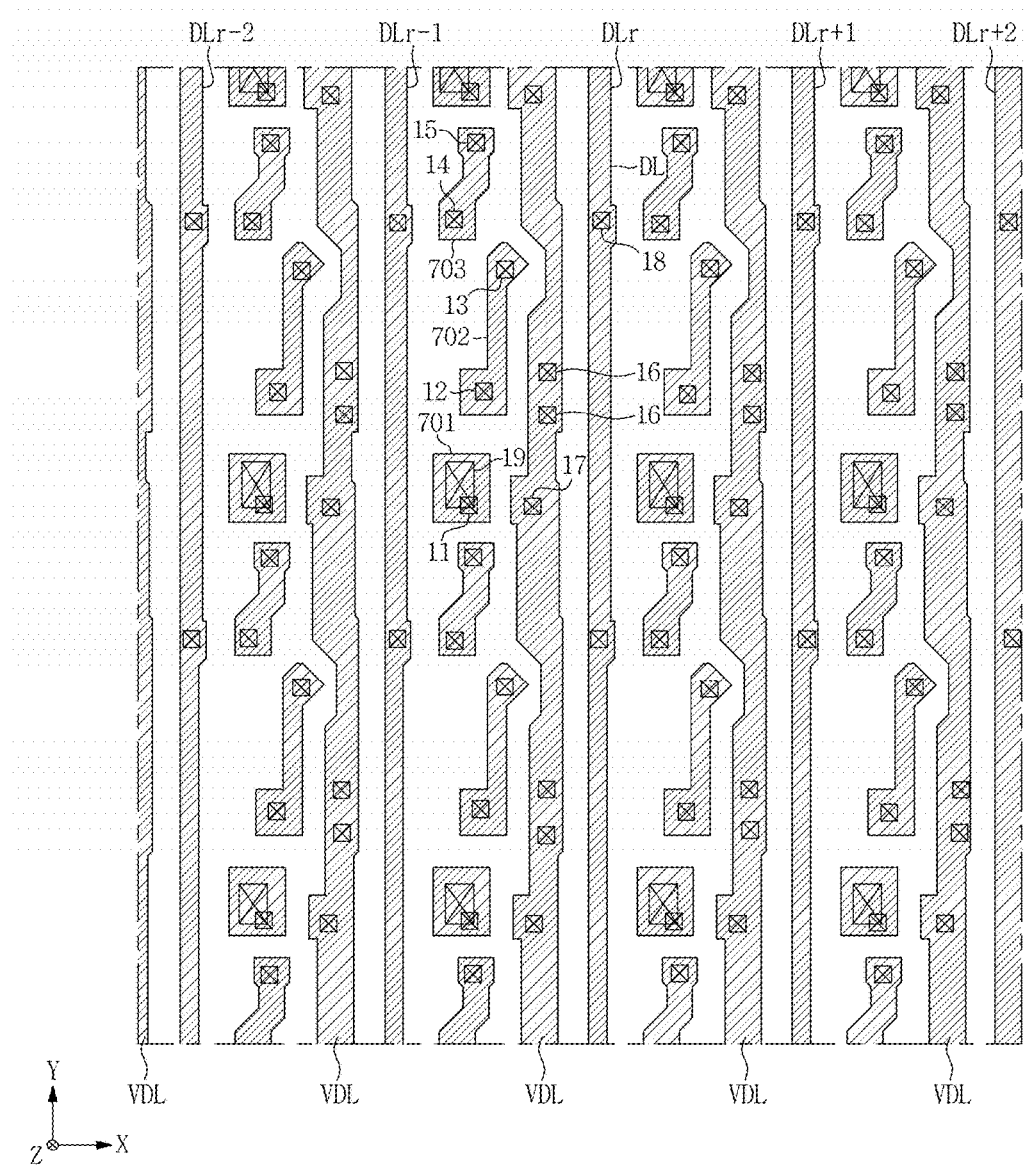
Figure 7E:
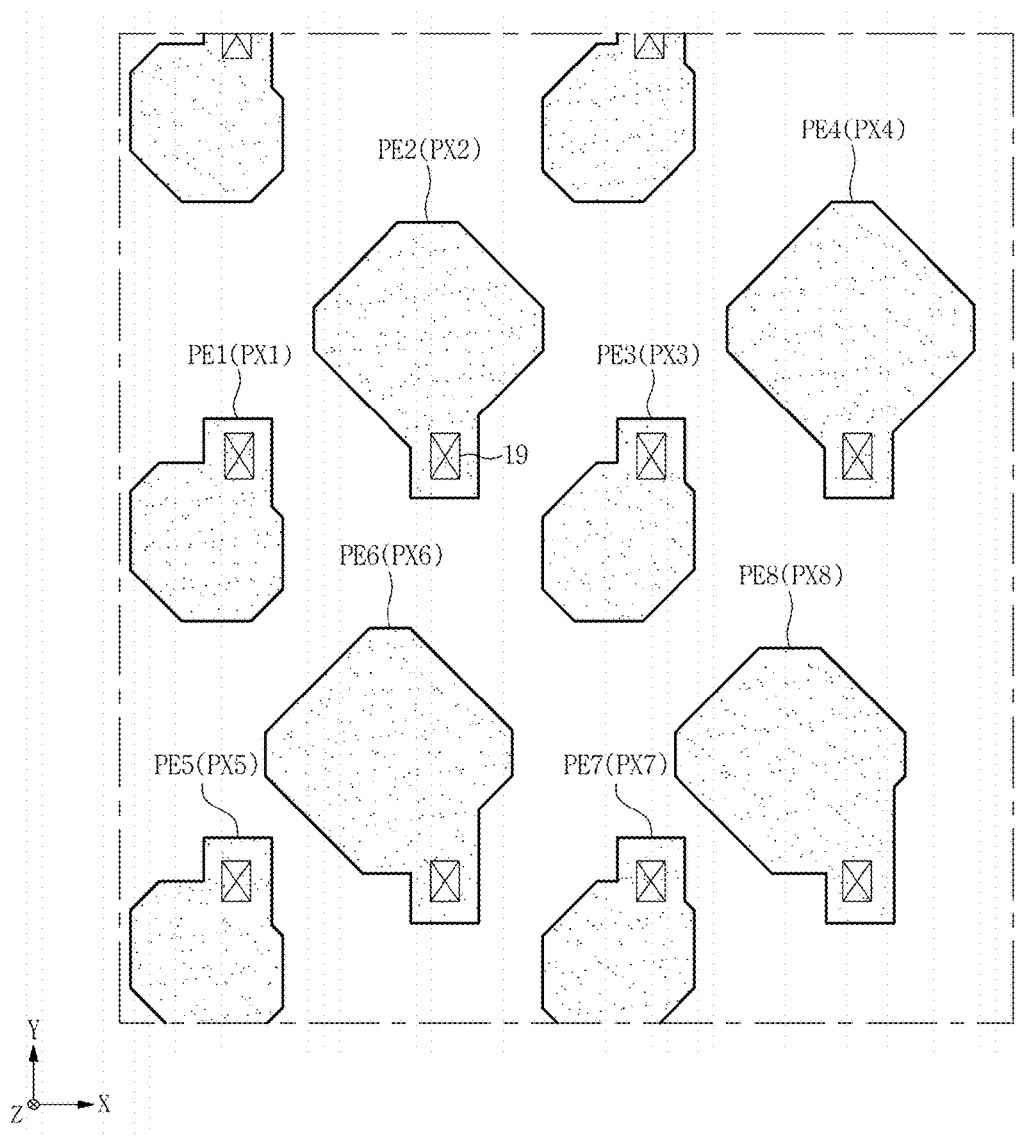
Figure 7F:
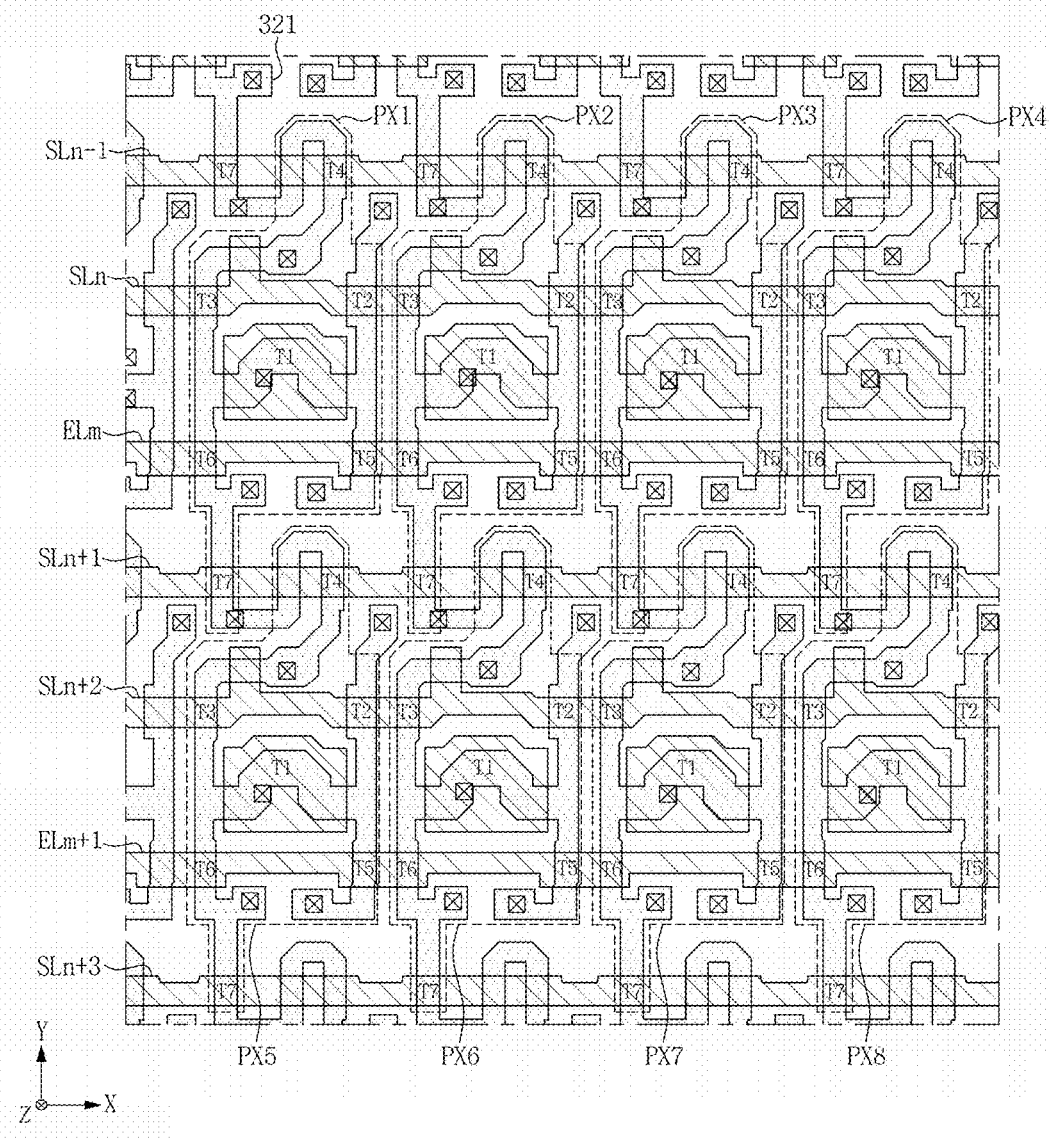
Figure 7G:
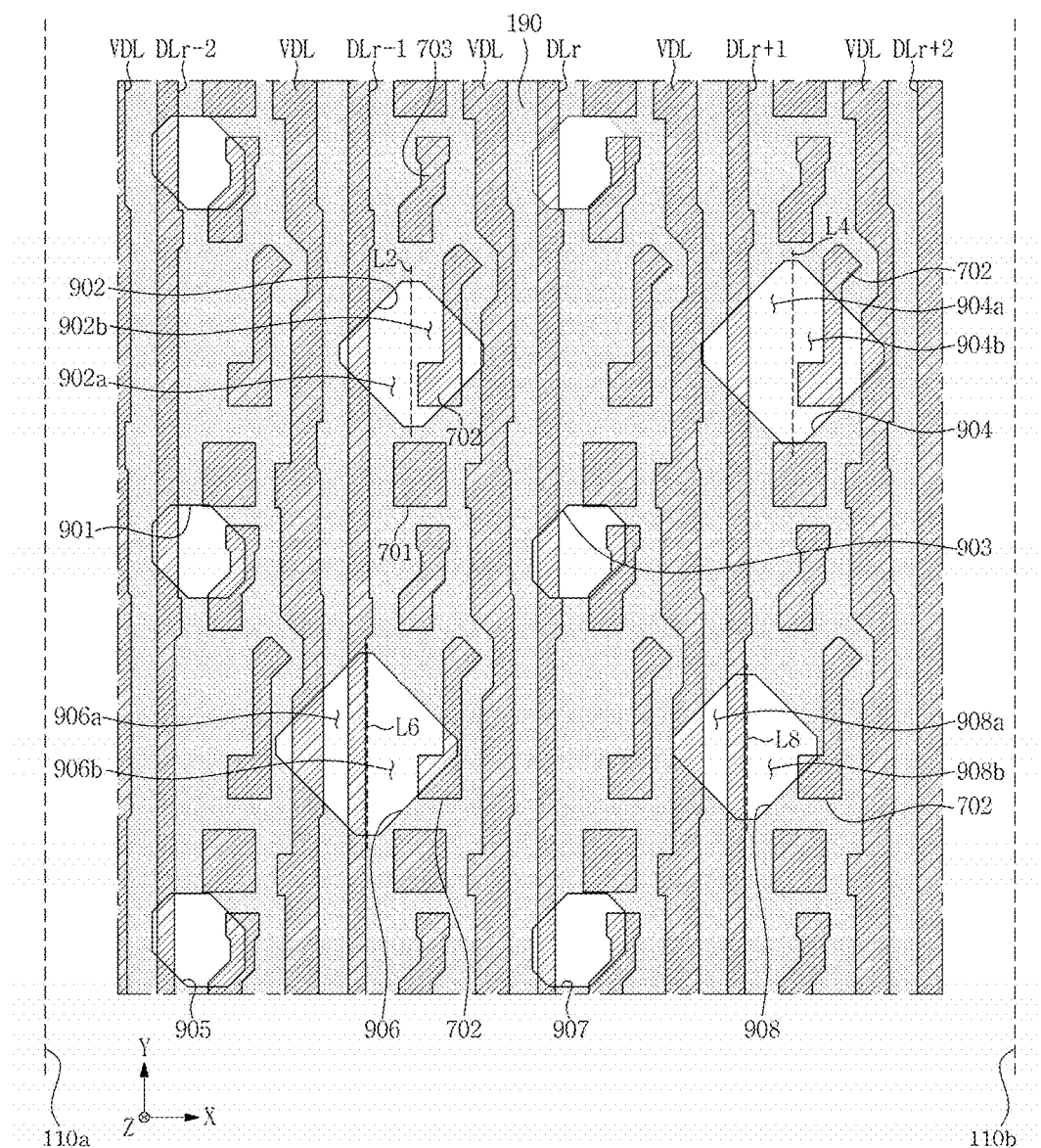

More particularly, FIG. 7A is a view illustrating the semiconductor layer 321 of FIG. 6; FIG. 7B is a view illustrating the (n−1)-th scan line SLn−1, the n-th scan line SLn, the (n+1)-th scan line SLn+1, an (n+2)-th scan line SLn+2, the m-th light emission control line ELm and an (m+1)-th light emission control line ELm+1 of FIG. 6; FIG. 7C is a view illustrating the initialization line IL and the capacitor electrode 201 of FIG. 6; FIG. 7D is a view illustrating the first connection electrode 701, the second connection electrode 702, the third connection electrode 703, an (r−2)-th data line DLr−2, an (r−1)-th data line DLr−1, an r-th data line DLr, an (r+1)-th data line DLr1, an (r+2)-th data line DLr+2 and a high potential line VDL of FIG. 6; FIG. 7E is a view illustrating the first, second, third, fourth, fifth, sixth, seventh and eighth pixel electrodes PE1, PE2, PE3, PE4, PE5, PE6, PE7 and PE8 of FIG. 6; FIG. 7F is a view illustrating the semiconductor layer 321, the (n−1)-th scan line SLn−1, the n-th scan line SLn, the (n+1)-th scan line SLn+1, the (n+2)-th scan line SLn+2, the m-th light emission control line ELm and the (m+1)-th light emission control line ELm+1 of FIG. 6; and FIG. 7G is a view illustrating the first connection electrode 701, the second connection electrode 702, the third connection electrode 703, the (r−2)-th data line DLr−2, the (r−1)-th data line DLr−1, the r-th data line DLr, the (r+1)-th data line DLr+1, the (r+2)-th data line DLr+2, the high potential line VDL and the light blocking layer 190.

In an exemplary embodiment, among a plurality of pixels shown in FIG. 6, four pixels connected in common to the m-th light emission control line ELm are referred to as a first pixel PX1, a second pixel PX2, a third pixel PX3 and a fourth pixel PX4, respectively. In such an embodiment, four pixels connected in common to the (m+1)-th light emission control line ELm+1 are referred to as a fifth pixel PX5, a sixth pixel PX6, a seventh pixel PX7 and an eighth pixel PX8, respectively.

The second pixel PX2 of FIG. 6 is substantially to the same as the pixel PX of FIG. 3 described above. The first pixel PX1, the third pixel PX3, the fourth pixel PX4, the fifth pixel PX5, the sixth pixel PX6, the seventh pixel PX7, and the eighth pixel PX8 may have a substantially same configuration as that of the pixel PX of FIG. 3.

The first pixel PX1, the third pixel PX3, the fifth pixel PX5 and the seventh pixel PX7 may emit lights having a substantially same color as each other. In one exemplary embodiment, for example, each of the first pixel PX1, the third pixel PX3, the fifth pixel PX5 and the seventh pixel PX7 may be a green pixel which emits a green light.

The second pixel PX2 and the eighth pixel PX8 may emit lights having a substantially same color as each other. In one exemplary embodiment, for example, each of the second pixel PX2 and the eighth pixel PX8 may be a red pixel which emits a red light.

The fourth pixel PX4 and the sixth pixel PX6 may emit lights having a substantially same color as each other. In one exemplary embodiment, for example, each of the fourth pixel PX4 and the sixth pixel PX6 may be a blue pixel which emits a blue light.

Four adjacent pixels may define one unit pixel. In one exemplary embodiment, for example, the first pixel PX1, the second pixel PX2, the third pixel PX3 and the sixth pixel PX6, which are arranged adjacent to each other, collectively define a unit pixel (hereinafter, referred to as "a first unit pixel"). In such an embodiment, the third pixel PX3, the fourth pixel PX4, the eighth pixel PX8 and another green pixel not illustrated, which are arranged adjacent to each other, collectively define another unit pixel (hereinafter, referred to as "a second unit pixel"). In such an embodiment, the another green pixel which is not illustrated is connected to the m-th light emission control line ELm and is disposed adjacent to the fourth pixel PX4 and the eighth pixel PX8. The first unit pixel and the second unit pixel adjacent to each other in such a manner share a green pixel (e.g., the third pixel PX3) disposed therebetween. In such an embodiment, the second pixel PX2 of the first unit pixel defines another unit pixel together with another three pixels adjacent to an upper side thereof, and the sixth pixel PX6 of the first unit pixel defines still another unit pixel together with still another three pixels adjacent to a lower side thereof. In such an embodiment, the display device includes pixels of a pentile structure.

In an exemplary embodiment, as illustrated in FIGS. 6 and 7E, each pixel includes a pixel electrode. In one exemplary embodiment, for example, the first pixel PX1 includes a first pixel electrode PE1, the second pixel PX2 includes a second pixel electrode PE2, the third pixel PX3 includes a third pixel electrode PE3, the fourth pixel PX4 includes a fourth pixel electrode PE4, the fifth pixel PX5 includes a fifth pixel electrode PE5, the sixth pixel PX6 includes a sixth pixel electrode PE6, the seventh pixel PX7 includes a seventh pixel electrode PE7, and the eighth pixel PX8 includes an eighth pixel electrode PE8.

Pixel electrodes included in pixels that emit lights having a substantially same color may have a substantially equal size (e.g., area) as each other. In one exemplary embodiment, for example, as illustrated in FIGS. 6 and 7E, the first pixel electrode PE1, the third pixel electrode PE3, the fifth pixel electrode PE5 and the seventh pixel electrode PE7 of the green pixels may have a substantially equal size as each other. In such an embodiment, the second pixel electrode PE2 and the eighth pixel electrode PE8 of the red pixels may have a substantially equal size as each other. In such an embodiment, the fourth pixel electrode PE4 and the sixth pixel electrode PE6 of the blue pixels may have a substantially equal size as each other.

The pixel electrode of the green pixel of the pixel electrodes may have the smallest size. In one exemplary embodiment, for example, as illustrated in FIGS. 6 and 7E, the first pixel electrode PE1, the third pixel electrode PE3, the fifth pixel electrode PE5 and the seventh pixel electrode PE7 of the first, second, third, fourth, fifth, sixth and seventh pixel electrodes PE1, PE2, PE3, PE4, PE5, PE6 and PE7 may have the smallest size.

In such an embodiment, the pixel electrode of the blue pixel may have a size larger than a size of the pixel electrode of the red pixel. In one exemplary embodiment, for example, as illustrated in FIGS. 6 and 7E, the fourth pixel electrode PE4 may have a size larger than a size of the second pixel electrode PE2. In such an embodiment, the fourth pixel electrode PE4 may have a size larger than a size of the eighth pixel electrode PE8. In such an embodiment, the sixth pixel electrode PE6 may have a size larger than a size of the second pixel electrode PE2. In such an embodiment, the sixth pixel electrode PE6 may have a size larger than a size of the eighth pixel electrode PE8.

In an exemplary embodiment, as illustrated in FIG. 7F, each of the pixels PX1, PX2, PX3, PX4, PX5, PX6, PX7 and PX8 further include the first, second, third, fourth, fifth, sixth and seventh switching elements T1, T2, T3, T4, T5, T6 and T7 and the storage capacitor Cst. The first, second, third, fourth, fifth, sixth and seventh switching elements T1, T2, T3, T4, T5, T6 and T7 and the storage capacitor Cst of each of the pixels PX1, PX2, PX3, PX4, PX5, PX6, PX7 and PX8 are substantially the same as those described above with reference to FIGS. 3 to 6, and any repetitive detailed descriptions thereof will hereinafter be omitted or simplified.

In an exemplary embodiment, as illustrated in FIG. 6, the first pixel PX1, the second pixel PX2, the third pixel PX3 and the fourth pixel PX4 are connected to a same scan line and a same light emission control line. In one exemplary embodiment, for example, the first pixel PX1, the second pixel PX2, the third pixel PX3 and the fourth pixel PX4 are connected in common to the (n−1)-th scan line SLn−1, the n-th scan line SLn, the (n+1)-th scan line SLn+1 and the m-th light emission control line ELm.

In such an embodiment, as illustrated in FIG. 6, the fifth pixel PX5, the sixth pixel PX6, the seventh pixel PX7 and the eighth pixel PX8 are connected to a same scan line and a same light emission control line. In one exemplary embodiment, for example, the fifth pixel PX5, the sixth pixel PX6, the seventh pixel PX7 and the eighth pixel PX8 are connected in common to the (n+1)-th scan line SLn+1, the (n+2)-th scan line SLn+2, an (n+3)-th scan line SLn+3 and the (m+1)-th light emission control line ELm+1.

The first pixel PX1 and the fifth pixel PX5 are connected in common to a same data line. In one exemplary embodiment, for example, the first pixel PX1 and the fifth pixel PX5 are connected in common to the (r−1)-th data line DLr−1.

The second pixel PX2 and the sixth pixel PX6 are connected in common to a same data line. In one exemplary embodiment, for example, the second pixel PX2 and the sixth pixel PX6 are connected in common to the r-th data line DLr.

The third pixel PX3 and the seventh pixel PX7 are connected in common to a same data line. In one exemplary embodiment, for example, the third pixel PX3 and the seventh pixel PX7 are connected in common to the (r+1)-th data line DLr+1.

The fourth pixel PX4 and the eighth pixel PX8 are connected in common to a same data line. In one exemplary embodiment, for example, the fourth pixel PX4 and the eighth pixel PX8 are connected in common to the (r+2)-th data line DLr+2.

Hereinafter, the first, second, third and fourth pixels PX1, PX2, PX3 and PX4 connected in common to the (n−1)-th scan line SLn−1, the n-th scan line SLn, the (n+1)-th scan line SLn+1, and the m-th light emission control line ELm are defined as a first pixel group, and the fifth, sixth, seventh and eighth pixels PX5, PX6, PX7 and PX8 connected in common to the (n+1)-th scan line SLn+1, the (n+2)-th scan line SLn+2, the (n+3)-th scan line SLn+3 and the (m+1)-th light emission control line Elm+1 are defined as a second pixel group.

In an exemplary embodiment, the first pixel group and the second pixel group are connected to different light emission control lines. In such an embodiment, the different light emission control lines are disposed adjacent to each other. In one exemplary embodiment, for example, the first pixel group is connected to the m-th light emission control line ELm and the second pixel group is connected to the (m+1)-th light emission control line ELm+1.

In an exemplary embodiment, as described above, the light emission area 900 of each pixel may be divided into a plurality of divided areas. In one exemplary embodiment, for example, as illustrated in FIG. 7G, the first, second, third, fourth, fifth, sixth, seventh and eighth pixels PX1, PX2, PX3, PX4, PX5, PX6, PX7 and PX8 include first, second, third, fourth, fifth, sixth, seventh and eighth light emission areas 901, 902, 903, 904, 905, 906, 907 and 908, respectively. In such an embodiment, each of the second light emission area 902, the fourth light emission area 904, the sixth light emission area 906 and the eighth light emission area 908 may include a first divided area 902a, 904a, 906a or 908a, and a second divided area 902b, 904b, 906b, or 908b.

The first divided area and the second divided area of one light emission area may have a substantially equal size as each other. In one exemplary embodiment, for example, the first divided area 902a of the second pixel PX2 and the second divided area 902b of the second pixel PX2 may have a substantially equal size as each other, the first divided area 904a of the fourth pixel PX4 and the second divided area 904b of the fourth pixel PX4 may have a substantially equal size as each other, the first divided area 906a of the sixth pixel PX6 and the second divided area 906b of the sixth pixel PX6 may have a substantially equal size as each other, and the first divided area 908a of the eighth pixel PX8 and the second divided area 908b of the eighth pixel PX8 may have a substantially equal size as each other.

In an exemplary embodiment, as illustrated in FIG. 7G, each of the light emission areas 902, 904, 906 and 908 may be divided into two divided areas by an imaginary division line. In one exemplary embodiment, for example, the second light emission area 902 may be divided into two divided areas 902a and 902b by a second imaginary division line L2, the fourth light emission area 904 may be divided into two divided areas 904a and 904b by a fourth imaginary division line L4, the sixth light emission area 906 may be divided into two divided areas 906a and 906b by a sixth imaginary division line L6, and the eighth light emission area 908 may be divided into two divided areas 908a and 908b by an eighth imaginary division line L8.

Each of the division lines L2, L4, L6 and L8 is parallel to the data line DL and crosses a center of the corresponding light emission area. In one exemplary embodiment, for example, each of the division lines L2, L4, L6 and L8 is parallel to the y-axis and passes through the center of the corresponding light emission area.

In an exemplary embodiment, the first and second divided areas included in one light emission area have a symmetrical shape with respect to the division line. Alternatively, the first and second divided areas included in one light emission area may have different shapes.

In an exemplary embodiment, as illustrated in FIG. 7G, facing sides of the substrate 110 may be defined as a first side 110a and a second side 110b, respectively. As used herein, the first side 110a and the second side 110b are sides substantially parallel to the data line DL and each of the first side 110a and the second side 110b extends in the y-axis direction.

Among a light emission area included in one pixel, the first divided area is located between a division line of the light emission area and the first side 110a, and the second divided area is located between the division line of the light emission area and the second side 110b. In an exemplary embodiment, the first divided area 902a of the second light emission area 902 is located between the second division line L2 and the first side 110a, and the second divided area 902b of the second light emission area 902 is located between the second division line L2 and the second side 110b. In such an embodiment, the first divided area 904a of the fourth light emission area 904 is located between the fourth division line L4 and the first side 110a and the second divided area 904b of the fourth light emission area 904 is located between the fourth division line L4 and the second side 110b. In such an embodiment, the first divided area 906a of the sixth light emission area 906 is located between the sixth division line L6 and the first side 110a and the second divided area 906b of the sixth light emission area 906 is located between the sixth division line L6 and the second side 110b. In such an embodiment, the first divided area 908a of the eighth light emission area 908 is located between the eighth division line L8 and the first side 110a and the second divided area 908b of the eighth light emission area 908 is located between the eighth division line L8 and the second side 110b.

The first divided area of the first divided area and the second divided area of one light emission area is closer to the first side 110a. In one exemplary embodiment, for example, a shortest distance from a specific point (hereinafter, referred to as "a first point") of the first divided area 902a included in the second light emission area 902 to the first side 110a is defined as a first distance and a shortest distance from a specific point (hereinafter, referred to as "a second point") of the second divided area 902b included in the second light emission area 902 to the first side 110a is defined as a second distance, the first distance is shorter than the second distance. In such an embodiment, the first point and the second point are located at portions except for a boundary portion between the first and second divided areas 902a and 902b. In such an embodiment, the first distance and the second distance are distances measured along the x-axis direction.

In an exemplary embodiment, the second divided area of the first divided area and the second divided area of one light emission area is closer to the second side 110b.

An overlap area (hereinafter, referred to as "a first overlap area") between the first divided area 902a of the second light emission area 902 and the fourth pattern is different from an overlap area (hereinafter, referred to as "a second overlap area") between the second divided area 902b of the second light emission area 902 and the fourth pattern. In one exemplary embodiment, for example, as illustrated in FIG. 7G, the second overlap area may be larger than the first overlap area. In an exemplary embodiment, as illustrated in FIG. 7G, a portion of the (r−1)-th data line DLr−1 is located in the first divided area 902a of the second light emission area 902, and a portion of the second connection electrode 702 and a portion of the high potential line VDL are located in the second divided area 902b of the second connection area 902. In such an embodiment, the portion of the second connection electrode 702 and the portion of the high potential line VDL overlapping the second divided area 902b may have a planar area larger than a planar area of the portion of the (r−1)-th data line DLr−1 overlapping the first divided area 902a.

In such an embodiment, an overlap area between the first divided area 904a of the fourth light emission area 904 and the fourth pattern is different from an overlap area between the second divided area 904b of the fourth light emission area 904 and the fourth pattern.

In such an embodiment, an overlap area between the first divided area 906a of the sixth light emission area 906 and the fourth pattern is different from an overlap area between the second divided area 906b of the sixth light emission area 906 and the fourth pattern.

In such an embodiment, an overlap area between the first divided area 908a of the eighth light emission area 908 and the fourth pattern is different from an overlap area between the second divided area 908b of the eighth light emission area 908 and the fourth pattern.

In an exemplary embodiment, light emission areas of pixels connected to a same scan line (or a light emission control line) overlap the fourth pattern in a substantially same manner as that described above. In one exemplary embodiment, for example, where an overlap area between the second divided area 902b of the second light emission area 902 and the fourth pattern is larger than an overlap area between the first divided area 902a of the second light emission area 902 and the fourth pattern, an overlap area between the second divided area 904b of the fourth light emission area 904 and the fourth pattern is larger than an overlap area between the first divided area 904a of the fourth light emission area 904 and the fourth pattern. In an exemplary embodiment, as illustrated in FIG. 7G, a portion of the (r+1)-th data line DLr+1 and a portion of the high potential line VDL are located in the first divided area 904a of the fourth light emission area 904, and a portion of the second connection electrode 702 and a portion of the high potential line VDL are located in the second divided area 904b of the fourth light emission area 904. In such an embodiment, the portion of the second connection electrode 702 and the portion of the high potential line VDL overlapping the second divided area 904b has a planar area larger than a planar area of the portion of the (r+1)-th data line DLr+1 and the portion of the high potential line VDL overlapping the first divided area 904a.

Although not illustrated, in an exemplary embodiment where an overlap area between the first divided area 902a of the second light emission area 902 and the fourth pattern is larger than an overlap area between the second divided area 902b of the second light emission area 902 and the fourth pattern, an overlap area between the first divided area 904a of the fourth light emission area 904 and the fourth pattern is larger than an overlap area between the second divided area 904b of the fourth light emission area 904 and the fourth pattern.

In an exemplary embodiment, as illustrated in FIG. 7G, where an overlap area between the first divided area 906a of the sixth light emission area 906 and the fourth pattern is larger than an overlap area between the second divided area 906b of the sixth light emission area 906 and the fourth pattern, an overlap area between the first divided area 908a of the eighth light emission area 908 and the fourth pattern is larger than an overlap area between the second divided area 908b of the eighth light emission area 908 and the fourth pattern.

Although not illustrated, in an exemplary embodiment where an overlap area between the second divided area 906b of the sixth light emission area 906 and the fourth pattern is larger than an overlap area between the first divided area 906a of the sixth light emission area 906 and the fourth pattern, an overlap area between the second divided area 908b of the eighth light emission area 908 and the fourth pattern is larger than an overlap area between the first divided area 908a of the eighth light emission area 908 and the fourth pattern In an exemplary embodiment, light emission areas of pixels that are connected to different scan lines (or light emission control lines) and emit lights having a substantially same color as each other overlap the fourth pattern in different manners from each other. In one exemplary embodiment, for example, in pixels that emit lights having a substantially same color as each other, a light emission area of a pixel connected to the odd-numbered light emission control line and a light emission area of a pixel connected to the even-numbered light emission control line may overlap the fourth pattern in different manners from each other. In an exemplary embodiment, when the m-th light emission control line ELm is an odd-numbered light emission control line and the (m+1)-th light emission control line ELm+1 is an even-numbered light emission control line, as illustrated in FIG. 7, an overlap area between the second divided area 902b of the second light emission area 902 and the fourth pattern is larger than an overlap area between the first divided area 902a of the second light emission area 902 and the fourth pattern, and an overlap area between the first divided area 908a of the eighth light emission area 908 and the fourth pattern is larger than an overlap area between the second divided area 908b of the eighth light emission area 908 and the fourth pattern.

In such an embodiment, as illustrated in FIG. 7G, where an overlap area between the second divided area 904b of the fourth light emission area 904 and the fourth pattern is larger than an overlap area between the first divided area 904a of the fourth light emission area 904 and the fourth pattern, an overlap area between the first divided area 906a of the sixth light emission area 906 and the fourth pattern is larger than an overlap area between the second divided area 906b of the sixth light emission area 906 and the fourth pattern.

In an exemplary embodiment, as described above, the second divided area of the pixel connected to the odd-numbered light emission control line ELm (hereinafter, referred to as "an odd-numbered pixel") overlaps the fourth pattern more than the first divided area does. Accordingly, white angular difference ("WAD") of the odd-numbered pixel is larger when a user (or a viewer) views a screen of the display device obliquely from a right side of the display device than the case where the user views the screen of the display device obliquely from a left side of the display device. In one exemplary embodiment, for example, the WAD of the odd-numbered pixels is larger when the user obliquely views the screen of the display device from the second side 110b (i.e., the right side) than the case where the user obliquely views the screen of the display device from the first side 110a (i.e., the left side) in FIG. 7G. This is because the fourth pattern having a relatively large planar area is located at the right side of the light emission area, i.e., the second divided area, in the odd-numbered pixel.

In such an embodiment, the first divided area of the pixel connected to the even-numbered light emission control line ELm (hereinafter, referred to as "an even-numbered pixel") overlaps the fourth pattern more than the second divided area does. Accordingly, the WAD of the even-numbered pixel is larger when the user (or the viewer) views the screen of the display device obliquely from a left side of the display device than the case where the user views the screen of the display device obliquely from a right side of the display device. In one exemplary embodiment, for example, the WAD of the even-numbered pixels is larger when the user obliquely views the display device from the first side 110a (i.e., the left side) than the case where the user obliquely views the display device from the second side 110b (i.e., the right side) in FIG. 7G. This is because the fourth pattern having a relatively large planar area is located at the left side of the light emission area, i.e., the first divided area, in the even-numbered pixel.

In an exemplary embodiment, as described above, the light emission area of the odd-numbered pixel has a larger WAD value when viewed from the right than the left, while the light emission area of the even-numbered pixel has a larger WAD value when observed from the left than the right. In one exemplary embodiment, for example, the light emission area of the odd-numbered pixel has a relatively small WAD value when observed from the left and a relatively large WAD value when observed from the right. In such an embodiment, the light emission area of the even-numbered pixel has a relatively large WAD value when observed from the left side and a relatively small WAD value when observed from the right side.

Accordingly, in an exemplary embodiment, when the user views the screen of the display device from the left side of the display device, the small WAD value of the light emission area of the odd-numbered pixel and the large WAD value of the light emission area of the even-numbered pixel cancel each other out, such that an image having an intermediate WAD value may be viewed. In such an embodiment, when the user views the screen of the display device from the right side of the display device, the large WAD value of the light emission area of the odd-numbered pixel and the small WAD value of the light emission area of the even-numbered pixel cancel each other out, such that an image having an intermediate WAD value may be viewed.

Thus, in an exemplary embodiment of the display device according to the invention, the image viewed from the left side of the display device and the image viewed from the right side of the display device may have a substantially equal WAD values as each other, and accordingly, the WAD depending on the viewing direction may be substantially minimized. Accordingly, the image quality of the display device may be improved.

In an exemplary embodiment, the first light emission area 901, the third light emission area 903, the fifth light emission area 905 and the seventh light emission area 907 of the green pixels may overlap the fourth pattern in a manner substantially the same as a manner in which e the second light emission area 902, the fourth light emission area 904, the sixth light emission area 906 and the eighth light emission area 908 overlap the fourth pattern. In one exemplary embodiment, for example, an overlap area between the first divided area of the first light emission area 901 and the fourth pattern is different from an overlap area between the second divided area of the first light emission area 901 and the fourth pattern. In such an embodiment, when an overlap area between the second divided area of the first light emission area 901 and the fourth pattern is larger than an overlap area between the first divided area of the first light emission area 901 and the fourth pattern, an overlap area between the second divided area of the third light emission area 903 and the fourth pattern is larger than an overlap area between the first divided area of the third light emission area 903 and the fourth pattern. In such an embodiment, when an overlap area between the second divided area of the first light emission area 901 and the fourth pattern is larger than an overlap area between the first divided area of the first light emission area 901 and the fourth pattern, an overlap area between the first divided area of the seventh light emission area 907 and the fourth pattern is larger than an overlap area between the second divided area of the seventh light emission area 907 and the fourth pattern.

Figure 8:
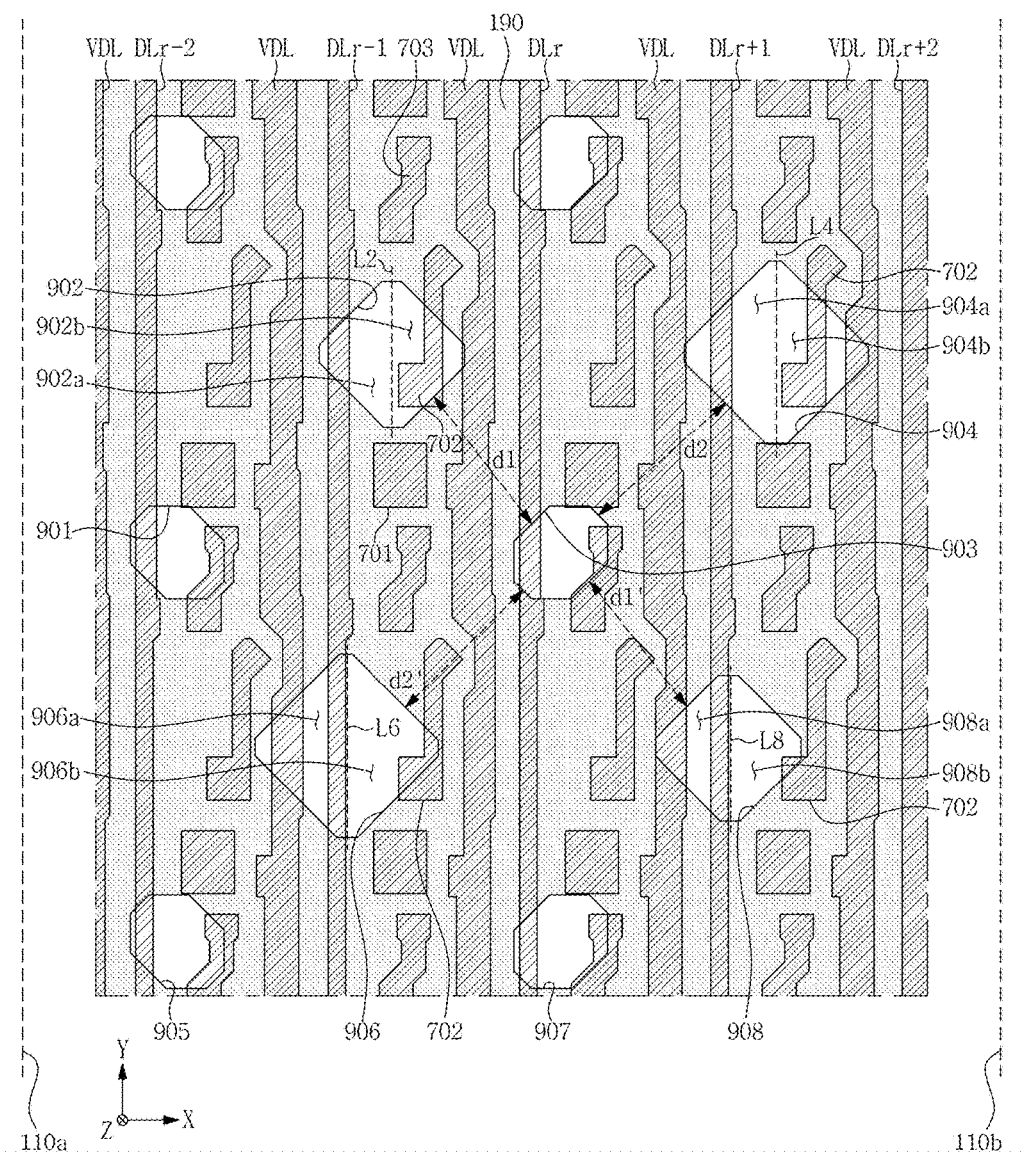
FIG. 8 is a view illustrating a distance between light emission areas of FIG. 7.

FIG. 8 is a view illustrating a distance between light emission areas 900 of FIG. 7.

In an exemplary embodiment, as illustrated in FIG. 8, four light emission areas 902, 904, 906 and 908 are disposed around the third light emission area 903 of the third pixel PX3 which emits a blue light.

Light emission areas of pixels that emit lights having a substantially same color face each other with the third light emission area 903 therebetween. In one exemplary embodiment, for example, the second light emission area 902 and the eighth light emission area 908 face each other with the third light emission area 903 therebetween. In such an embodiment, the fourth light emission area 904 and the sixth light emission area 906 face each other with the third light emission area 903 therebetween. In such an embodiment, the second light emission area 902 and the eighth light emission area 908 face each other in a first diagonal direction, and the fourth light emission area 904 and the sixth light emission area 906 face each other in a second diagonal direction which intersects the first diagonal direction. The first diagonal direction and the second diagonal direction may intersect perpendicularly to each other.

Light emission areas of the pixels, which face each other with the third light emission area 903 therebetween and emit lights having a substantially same color, are spaced apart from the third light emission area 903 at a substantially equal distance as each other. In an exemplary embodiment, as illustrated in FIG. 8, a distance d1 between the third light emission area 903 and the second light emission area 902 may be substantially equal to a distance d1' between the third light emission area 903 and the eighth light emission area 908. In such an embodiment, a distance d2 between the third light emission area 903 and the fourth light emission area 904 is substantially equal to a distance d2' between the third light emission area 903 and the sixth light emission area 906.

In an exemplary embodiment, the distance d1 between the third light emission area 903 and the second light emission area 902 may be substantially equal to or different from the distance d2 between the third light emission area 903 and the fourth light emission area 904. In such an embodiment, the distance d1' between the third light emission area 903 and the eighth light emission area 908 may be substantially equal to or different from the distance d2' between the third light emission area 903 and the sixth light emission area 906. The distance d1 between the third light emission area 903 and the second light emission area 902 may be substantially equal to or different from the distance d2' between the third light emission area 903 and the sixth light emission area 906. The distance d1' between the third light emission area 903 and the eighth light emission area 908 may be substantially equal to or different from the distance d2 between the third light emission area 903 and the fourth light emission area 904.

Figure 9:
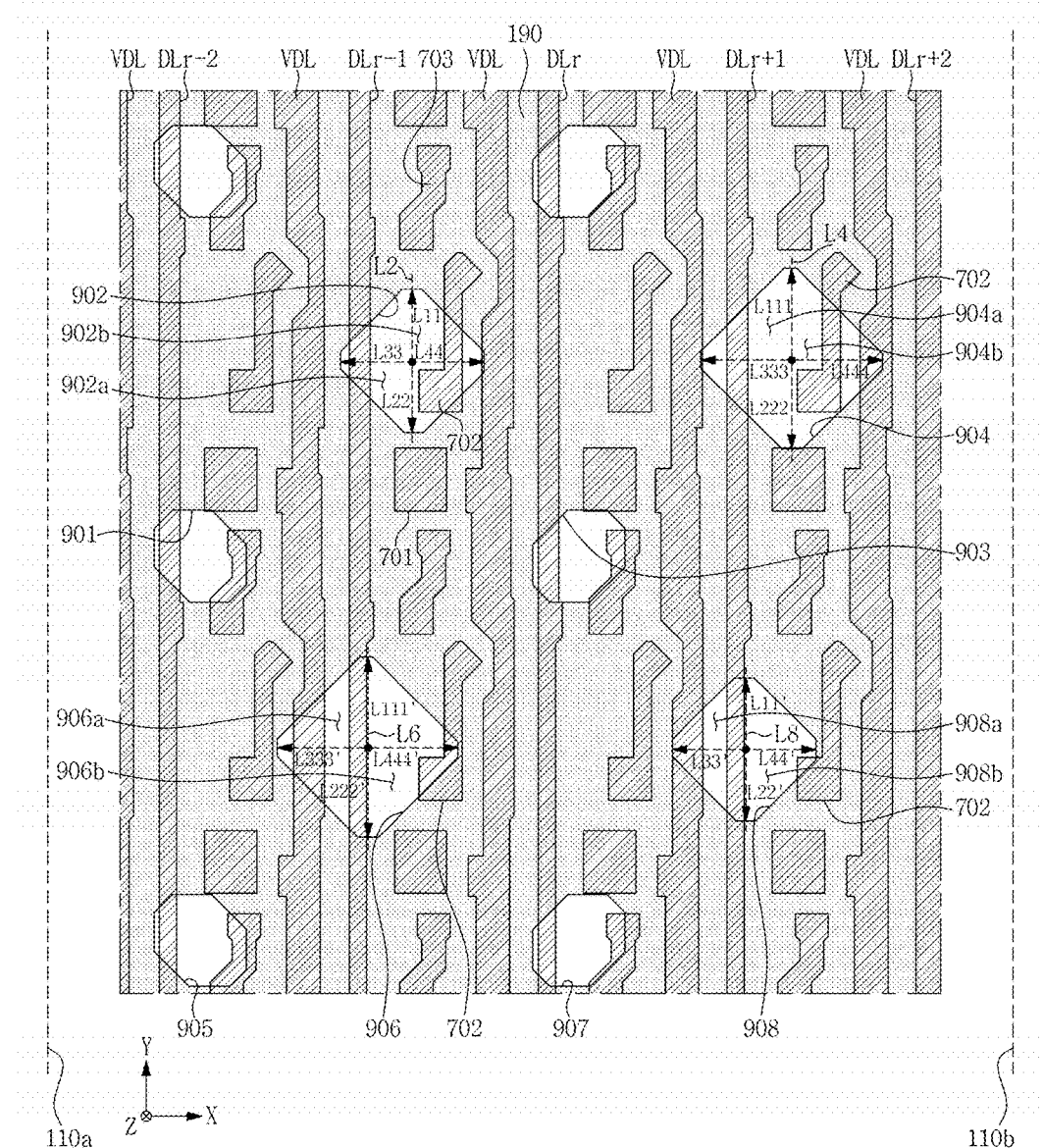
FIG. 9 a view illustrating a size of the light emission area of FIG. 7.

FIG. 9 is a view illustrating a size of the light emission area 900 of FIG. 7.

In an exemplary embodiment, as illustrated in FIG. 9, each of the first, second, third, fourth, fifth, sixth, seventh and eighth light emission areas 901, 902, 903, 904, 905, 906, 907 and 908 may have an octagonal shape. In such an embodiment, each of the second light emission area 902, the fourth light emission area 904, the sixth light emission area 906 and the eighth light emission area 908 may have an octagonal shape similar to a rhombus.

Distances from a center point of the second light emission area 902 to four sides of the second light emission area 902 in the x-axis direction and the y-axis direction are substantially equal to each other. In one exemplary embodiment, for example, a distance L11 from the center point of the second light emission area 902 to a first side of the second light emission area 902, a distance L22 from the center point of the second light emission area 902 to a second side of the second light emission area 902, a distance L33 from the center point of the second light emission area 902 to a third side of the second light emission area 902, and a distance L44 from the center point of the second light emission area 902 to a fourth side of the second light emission area 902 are substantially equal to each other.

In such an embodiment, distances from a center point of the eighth light emission area 908 to four sides of the eighth light emission area 908 in the x-axis direction and the y-axis direction are substantially equal to each other. In one exemplary embodiment, for example, a distance L11' from the center point of the eighth light emission area 908 to a first side of the eighth light emission area 908, a distance L22' from the center point of the eighth light emission area 908 to a second side of the eighth light emission area 908, a distance L33' from the center point of the eighth light emission area 908 to a third side of the eighth light emission area 908, and a distance L44' from the center point of the eighth light emission area 908 to a fourth side of the eighth light emission area 908 are substantially equal to each other.

In such an embodiment, the distances between the center point of the second light emission area 902 and the four sides of the second light emission area 902 may be substantially equal to the distances between the center point of the eighth light emission area 908 and the four sides of the eighth light emission area 908, respectively, (i.e., L11=L11', L22=L22', L33=L33', and L44=L44').

Distances from a center point of the fourth light emission area 904 to the four sides of the fourth light emission area 904 in the x-axis direction and the y-axis direction are substantially equal to each other. In one exemplary embodiment, for example, a distance L111 from the center point of the fourth light emission area 904 to a first side of the fourth light emission area 904, a distance L222 from the center point of the fourth light emission area 904 to a second side of the fourth light emission area 904, a distance L333 from the center point of the fourth light emission area 904 to a third side of the fourth light emission area 904, and a distance L444 from the center point of the fourth light emission area 904 to a fourth side of the fourth light emission area 904 are substantially equal to each other.

In such an embodiment, distances from a center point of the sixth light emission area 906 to four sides of the sixth light emission area 906 in the x-axis direction and the y-axis direction are substantially equal to each other. In one exemplary embodiment, for example, a distance L111' from the center point of the sixth light emission area 906 to a first side of the sixth light emission area 906, a distance L222' from the center point of the sixth light emission area 906 to a second side of the sixth light emission area 906, a distance L333' from the center point of the sixth light emission area 906 to a third side of the sixth light emission area 906, and a distance L444' from the center point of the sixth light emission area 906 to a fourth side of the sixth light emission area 906 are substantially equal to each other.

In such an embodiment, the distances between the center point of the fourth light emission area 904 and the four sides of the fourth light emission area 904 may be substantially equal to the distances between the center point of the sixth light emission area 906 and the four sides of the sixth light emission area 906, respectively (i.e., L111=L111', L222=L222', L333=L333', and L444=L444').

Figure 10:
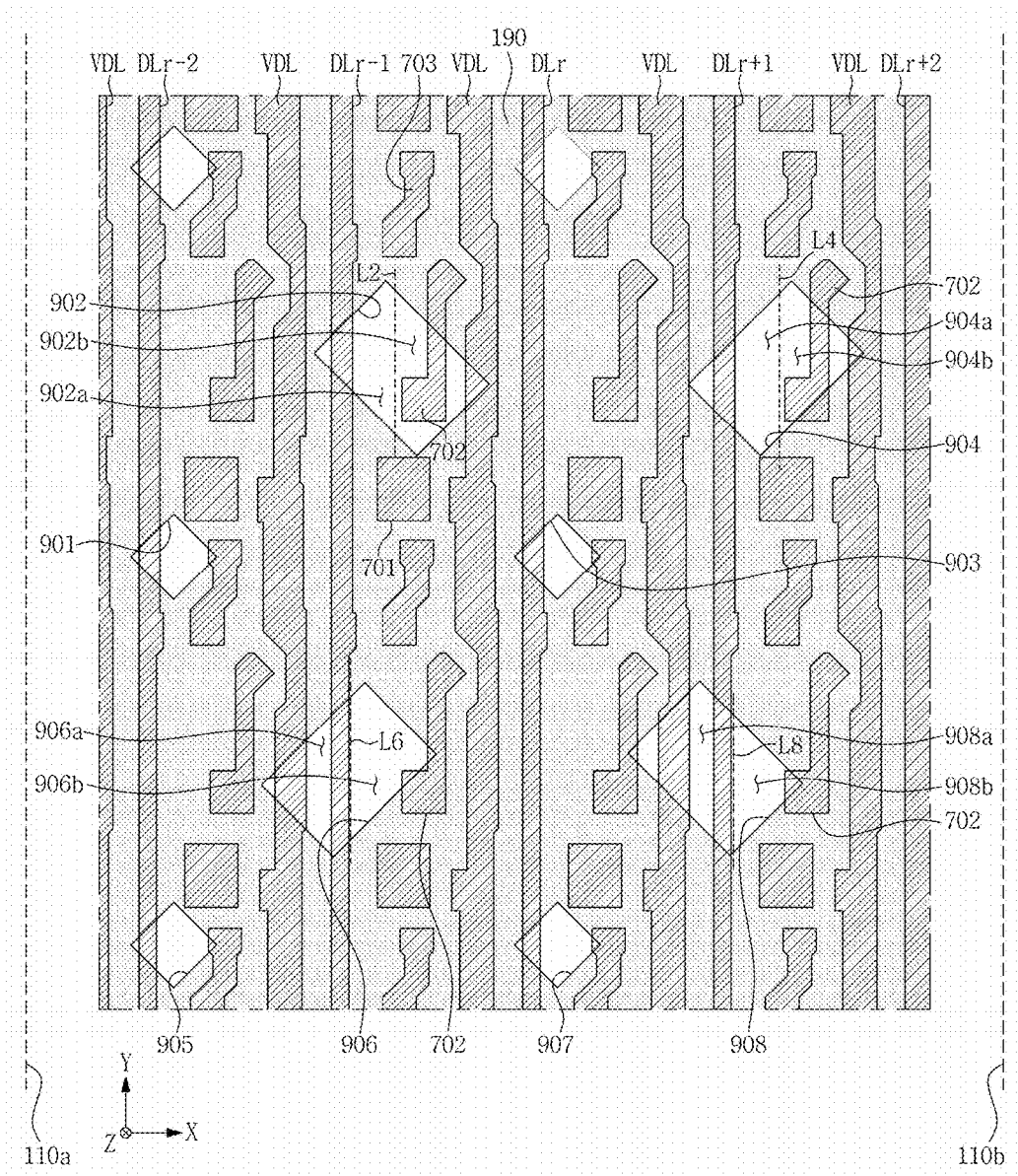
FIG. 10 is a view illustrating another shape of the light emission area.

FIG. 10 is a view illustrating another shape of the light emission area.

In an exemplary embodiment, as illustrated in FIG. 10, the light emission area 900 may have a rectangular or rhombic shape.

In one exemplary embodiment, for example, each of the second light emission area 902, the fourth light emission area 904, the sixth light emission area 906 and the eighth light emission area 908 of the red pixels or the blue pixels may have a quadrangular (e.g., rectangular) shape, and the first light emission area 901, the third light emission area 903, the fifth light emission area 905 and the seventh light emission area 907 of the green pixels which emit a green light may have a rhombic shape. In such an embodiment, where the light emission area has a quadrangular (e.g., rectangular) shape as described above, a pixel electrode corresponding to the light emission area also has a quadrangular (e.g., rectangular) shape.

Figure 11A:
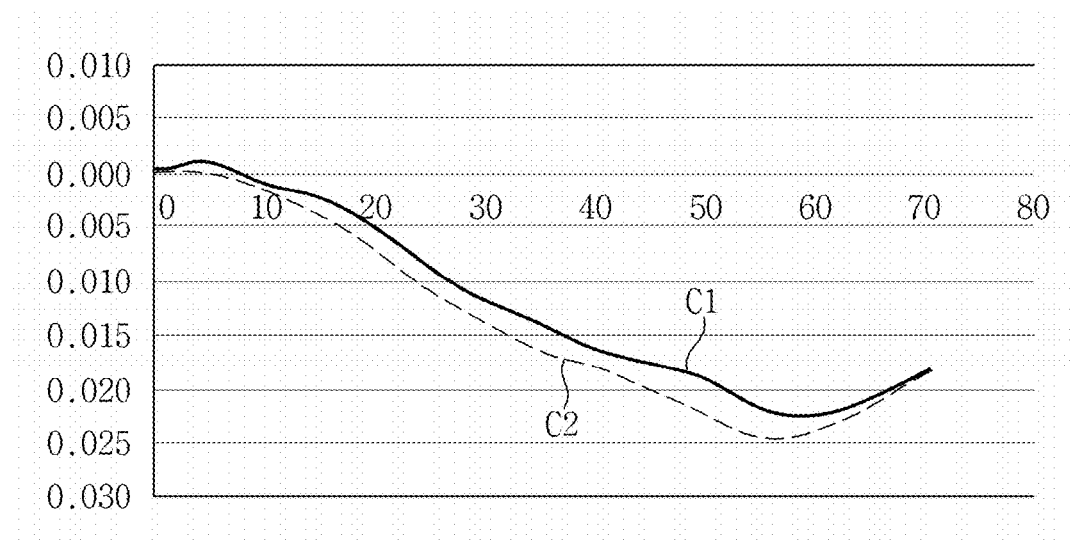
FIGS. 11A and 11B are graphs illustrating the effect of the display device according to an exemplary embodiment.
Figure 11B:
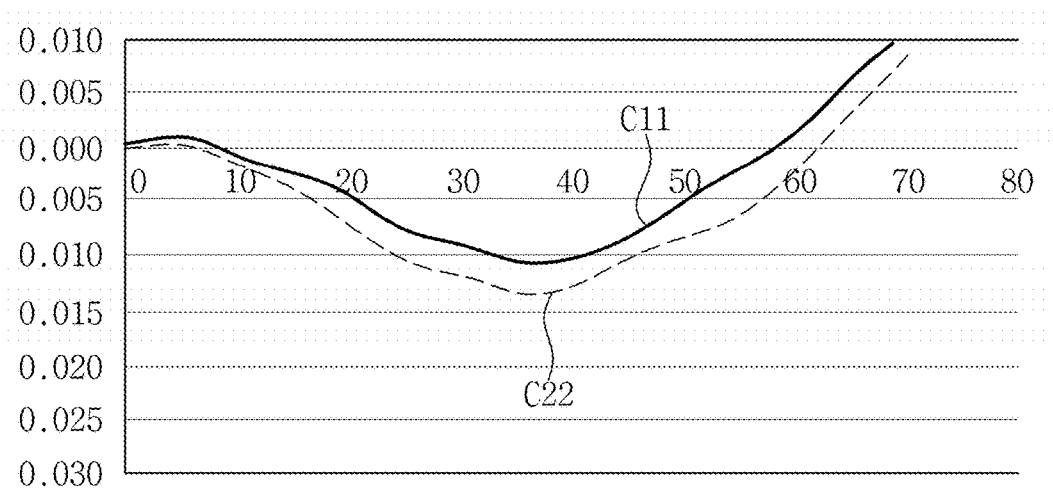

FIGS. 11A and 11B are graphs illustrating the effect of the display device according to an exemplary embodiment.

An x-axis coordinate of the graph illustrated in FIG. 11A represents a viewing angle. The viewing angle includes 0 degree, 10 degrees, 20 degrees, 30 degrees, 40 degrees, 50 degrees, 60 degrees, 70 degrees and 80 degrees. Each angle means an angle between an observation apparatus and a screen of the display device. In one exemplary embodiment, for example, 0 degree refers to an angle when the observation apparatus views the screen of the display device from the front. In addition, the remaining angles (e.g., 10 degrees, 20 degrees, 30 degrees, 40 degrees, 50 degrees, 60 degrees, 70 degrees and 80 degrees) are angles when the observation apparatus moves to a left or right side with respect to the front side of the screen and then views the screen from the moved position.

A y-axis of the graph illustrated in FIG. 11A shows an x coordinate value of WAD. The x-axis coordinate of the WAD means a value of $\Delta x$ on the x-axis of the commission internationale de l'Eclairage ("CIE") system of color specification. As used herein, the value of $\Delta x$ means a value obtained by subtracting an x-axis color coordinate value on a lateral side from an x-axis color coordinate value on a front side.

A first curve C1 of FIG. 11A represents the x-axis coordinate value of the WAD measured from the observation apparatus when the observation apparatus rotates to the right side of the display device by the above-described angle with respect to 0 degrees, and a second curve C2 represents the x-axis coordinate value of the WAD measured from the observation apparatus when the observation apparatus rotates to the left side of the display device by the above-described angle with respect to 0 degree.

As shown in FIG. 11A, the x-axis coordinate value of the WAD of the first curve C1 shows substantially no difference from the x-axis coordinate value of the WAD of the second curve C2. As shown in FIG. 11A, according to an exemplary embodiment, an image viewed from the left side of the display device and an image viewed from the right side of the display device may have a substantially equal WAD value, and accordingly, the WAD value (i.e., the x-axis coordinate value of the WAD) depending on the viewing direction may be substantially minimized.

The x-axis coordinate of the graph illustrated in FIG. 11B represents a viewing angle. The viewing angle includes 0 degrees, 10 degrees, 20 degrees, 30 degrees, 40 degrees, 50 degrees, 60 degrees, 70 degrees and 80 degrees. A detailed description of this observation angle will make reference to FIG. 11A and the related description.

A y-axis of the graph illustrated in FIG. 11B shows a Y coordinate value of WAD. The y-axis coordinate of the WAD means a value of $\Delta y$ on the y-axis of the CIE system of color specification. As used herein, the value of $\Delta y$ means a value obtained by subtracting a y-axis color coordinate value on a lateral side from a y-axis color coordinate value on a front side.

A first curve C11 of FIG. 11B represents the y-axis coordinate value of the WAD measured from the observation apparatus when the observation apparatus rotates to the right side of the display device by the above-described angle with respect to 0 degree, and a second curve C2 represents the y-axis coordinate value of the WAD measured from the observation apparatus when the observation apparatus rotates to the left side of the display device by the above-described angle with respect to 0 degree.

As shown in FIG. 11B, the y-axis coordinate value of the WAD of the first curve C11 shows substantially no difference from the y-axis coordinate value of the WAD of the second curve C22. As shown in FIG. 11B, according to an exemplary embodiment, an image viewed from the left side of the display device and an image viewed from the right side of the display device may have a substantially equal WAD value, and accordingly, the WAD value (i.e., the y-axis coordinate value of the WAD) depending on the viewing direction may be substantially minimized.

In an exemplary embodiment of a display device according to the invention, as set forth herein, an image observed from a left side of the display device and an image observed from a right side of the display device side of the display device may have a substantially equal WAD value. Accordingly, a deviation, i.e., the WAD value, depending on the viewing direction, may be substantially minimized. As a result, the image quality of the display device may be improved.

While the invention has been illustrated and described with reference to the exemplary embodiments thereof, it will be apparent to those of ordinary skill in the art that various changes in form and detail may be formed thereto without departing from the spirit and scope of the invention.

What is claimed is:

1. A display device comprising:
   a substrate comprising a first side and a second side facing each other;
   a first pixel and a second pixel connected to different scan lines, respectively, wherein the first pixel comprises a first pixel electrode on the substrate, and the second pixel comprises a second pixel electrode on the substrate;
   a light blocking layer defining a first light emission area corresponding to the first pixel and a second light emission area corresponding to the second pixel; and
   a plurality of patterns overlapping the first light emission area and the second light emission area and disposed on different layers between the first pixel electrode and the substrate, respectively, wherein a first pattern of a plurality of patterns is the closest to the first pixel electrode or the second pixel electrode,
   wherein each of the first and second light emission areas is divided into a first divided area and a second divided area, the first divided area of the first or second light emission area is closer to the first side than to the second side, an overlap area between the second divided area of the first light emission area and the first pattern is larger than an overlap area between the first divided area of the first light emission area and the first pattern, and an overlap area between the first divided area of the second light emission area and the first pattern is larger than an overlap area between the second divided area of the second light emission area and the first pattern.

2. The display device as claimed in claim 1, further comprising:
a first light emission control line connected to the first pixel; and
a second light emission control line connected to the second pixel.

3. The display device as claimed in claim 2, wherein the first light emission control line and the second light emission control line are adjacent to each other.

4. The display device as claimed in claim 2, wherein
the first light emission control line is an odd-numbered light emission control line, and
the second light emission control line is an even-numbered light emission control line.

5. The display device as claimed in claim 1, wherein the first pixel and the second pixel emit lights having a substantially same color as each other.

6. The display device as claimed in claim 5, wherein the first pixel emits a red light or a blue light.

7. The display device as claimed in claim 5, wherein the first pixel and the second pixel are connected to different data lines, respectively.

8. The display device as claimed in claim 7, further comprising:
another data line disposed between the different data lines connected to the first and second pixels, respectively.

9. The display device as claimed in claim 5, wherein a size of the first light emission area is substantially equal to a size of the second light emission area.

10. The display device as claimed in claim 1, wherein the first pixel and the second pixel emit lights having different colors from each other.

11. The display device as claimed in claim 10, wherein
the first pixel emits a red light or a blue light, and
the second pixel emits a red light or a blue light.

12. The display device as claimed in claim 10, wherein the first pixel and the second pixel are connected to a same data line.

13. The display device as claimed in claim 10, wherein a size of the first light emission area is different from a size of the second light emission area.

14. The display device as claimed in claim 1, wherein the first pattern comprises:
a plurality of data lines connected to a plurality of pixels comprising the first pixel and the second pixel;
a power supply line connected to the plurality of pixels comprising the first pixel and the second pixel;
a plurality of first connection electrodes connected to a plurality of pixel electrodes comprising the first pixel electrode and the second pixel electrode; and
a second connection electrode and a third connection electrode overlapping the different scan lines.

15. The display device as claimed in claim 14, wherein the first light emission area overlaps another data line adjacent to a data line connected to the first pixel.

16. The display device as claimed in claim 14, wherein the second light emission area overlaps another data line adjacent to a data line connected to the second pixel.

17. The display device as claimed in claim 14, wherein the first side and the second side are parallel to the data lines.

18. The display device as claimed in claim 1, wherein a size of the first divided area is substantially equal to a size of the second divided area.

19. The display device as claimed in claim 1, wherein the first divided area and the second divided area have a symmetrical shape with respect to an imaginary division line crossing a center of the first or second light emission area.

20. The display device as claimed in claim 1, wherein each of the first light emission area and the second light emission area has a rhombic shape or a quadrangular shape.

21. The display device as claimed in claim 1, further comprising:
a third pixel connected to a scan line the same as a scan line to which the first pixel is connected;
a fourth pixel connected to a scan line the same as a scan line to which the first pixel is connected; and
a fifth pixel connected to a scan line the same as a scan line to which the second pixel is connected,
wherein the light blocking layer further defines a third light emission area corresponding to the third pixel, a fourth light emission area corresponding to the fourth pixel, and a fifth light emission area corresponding to the fifth pixel.

22. The display device as claimed in claim 21, wherein
the first light emission area and the fifth light emission area face each other in a first diagonal direction with the fourth light emission area interposed therebetween, and
the second light emission area and the third light emission area face each other in a second diagonal direction which intersects the first diagonal direction with the fourth light emission area interposed therebetween.

23. The display device as claimed in claim 22, wherein
a distance between the fourth light emission area and the first light emission area is substantially equal to a distance between the fourth light emission area and the fifth light emission area; and
a distance between the fourth light emission area and the second light emission area is substantially equal to a distance between the fourth light emission area and the third light emission area.

* * * * *